United States Patent [19]
Adair et al.

[11] Patent Number: 5,959,325
[45] Date of Patent: Sep. 28, 1999

[54] METHOD FOR FORMING CORNERED IMAGES ON A SUBSTRATE AND PHOTOMASK FORMED THEREBY

[75] Inventors: William J. Adair, Underhill, Vt.; Richard A. Ferguson, Pleasant Valley, N.Y.; Mark C. Hakey; Steven J. Holmes, both of Milton, Vt.; David V. Horak, Essex Junction, Vt.; Robert K. Leidy, Burlington, Vt.; William Hsioh-Lien Ma, Fishkill, N.Y.; Ronald M. Martino, Danbury, Conn.; Song Peng, South Burlington, Vt.

[73] Assignee: International Business Machines Corporation, Armonk, N.Y.

[21] Appl. No.: 08/917,009

[22] Filed: Aug. 21, 1997

[51] Int. Cl.⁶ .................................................. H01L 27/108
[52] U.S. Cl. .......................... 257/302; 438/942; 438/387
[58] Field of Search .......................... 257/302, 296–313; 438/386–392, 424–438

[56] References Cited

U.S. PATENT DOCUMENTS

| | | |
|---|---|---|
| 3,385,702 | 5/1968 | Koehler. |
| 3,423,205 | 1/1969 | Skaggs et al.. |
| 3,508,919 | 4/1970 | Reimer. |
| 3,594,168 | 7/1971 | Compare. |
| 3,784,380 | 1/1974 | Compare. |
| 3,823,015 | 7/1974 | Fassett. |
| 4,591,547 | 5/1986 | Brownell. |
| 5,308,741 | 5/1994 | Kemp. |
| 5,340,700 | 8/1994 | Chen et al.. |
| 5,432,044 | 7/1995 | Shimizu. |
| 5,472,814 | 12/1995 | Lin. |
| 5,477,071 | 12/1995 | Hamamoto et al. ..................... 257/302 |
| 5,519,236 | 5/1996 | Ozaki ...................................... 257/302 |

FOREIGN PATENT DOCUMENTS 6-294967  10/1994  Japan.

OTHER PUBLICATIONS

B.J. Lin, Chessboard Method to Produce Electron–Beam Projection Masks, vol. 19, No. 7, Dec. 1976.

*Primary Examiner*—Olik Chaudhuri
*Assistant Examiner*—Daniel H. Mao
*Attorney, Agent, or Firm*—Schmeiser, Olsen & Watts; Mark F. Chadurjian

[57] ABSTRACT

A method for forming square shape images in a lithographic process is disclosed wherein a first plurality of lines running in a first direction is defined in a first, usually sacrificial, layer, and then a second resist is defined wherein the lines run in an intersecting pattern to those of the first layer, thereby creating cornered images wherever the first and second layer intersect and in the open areas between the lines. Methods are proposed for developing the square intersecting areas and the square angle areas defined by the openings. Additionally, a photomask is disclosed in which the length and width of the cornered images are independently patterned using the two-exposure process.

7 Claims, 17 Drawing Sheets

— ETCHED MASK HOLE
— ETCHED MASK BAR
— FORESHORTENING DATA

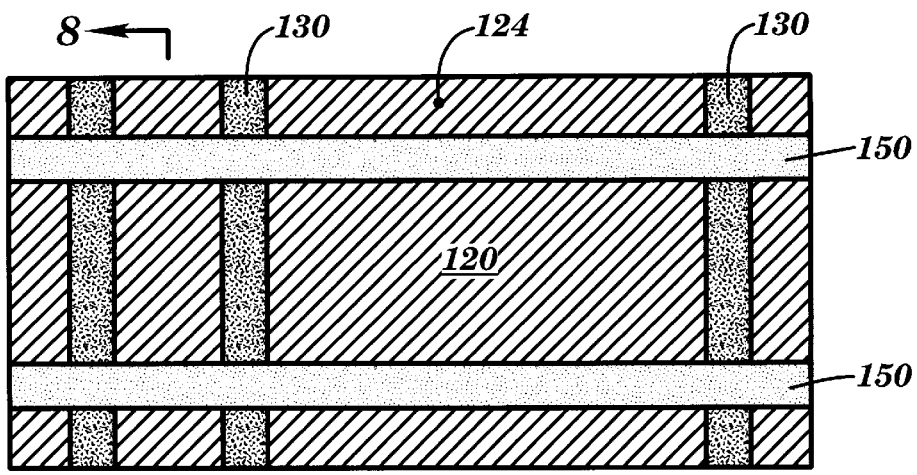
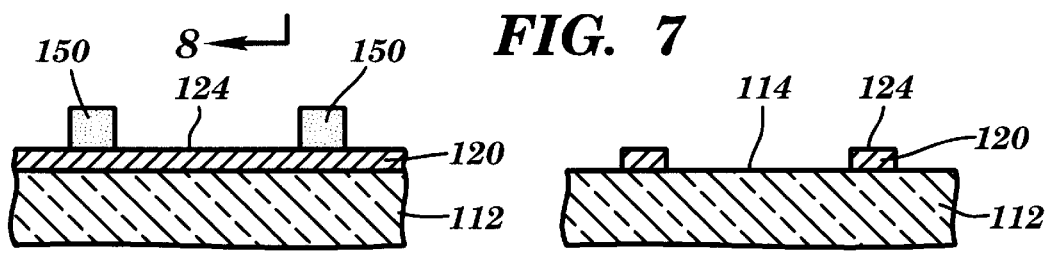 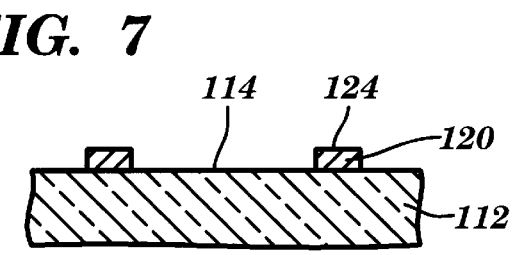
FIG. 8  FIG. 10
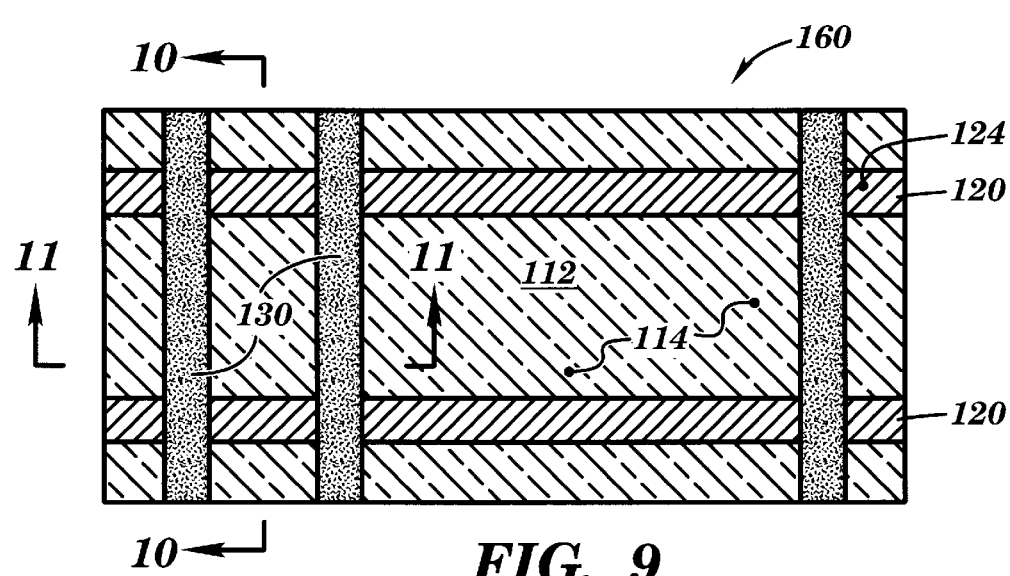
FIG. 9
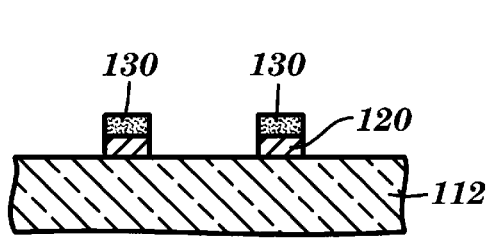 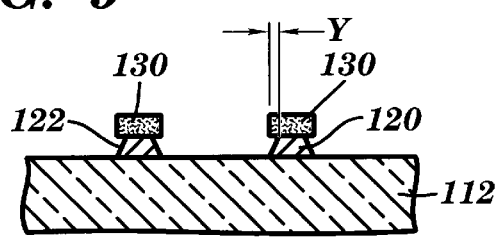
FIG. 11  FIG. 12

METHOD FOR FORMING CORNERED IMAGES ON A SUBSTRATE AND PHOTOMASK FORMED THEREBY

BACKGROUND OF THE INVENTION

1. Technical Field

This invention relates generally to the manufacture of integrated circuit (IC) chips and, more specifically, to a method for forming images having sharp corners during lithographic processing by exposing the feature in two angularly intersecting directions and a photomask formed thereby.

2. Background Art

Corner rounding and image foreshortening are problems for both photomask fabrication (especially for laser writers) and also for wafer fabrication. This problem, as depicted schematically in FIG. 1, is usually observed for small image shapes which are near the resolution limit of the lithographic exposure tool. In mask fabrication, for example, large features print with a shape that closely approximates the designed image. The length and width of the large shapes matches the designed values, with a slight rounding of the corners of the pattern. This corner rounding can be caused by the reticle etch process, which for chrome films has historically been an isotropic, wet process. It can also be caused by the limitations in the resolution of the writing beam of the reticle expose tool, whether e-beam or optical laser. For the printing of small images, which are at or near the resolution limit of the expose tool, the corner rounding becomes more pronounced, and the length of the image can be severely shortened relative to its designed length. This can be caused by several factors, including the loss of edge acuity of the aerial image at the resolution limit of the expose tool, the variation in effective exposure dose for small images relative to larger images, and the degradation of the aerial image by chemical diffusion processes in the photoresist after expose. These problems can be compounded for lithography on the wafer because the reticle rounding and shortening effects are combined with the tool and process components from the wafer processing.

Image shortening and rounding can significantly affect the ability to scale devices to smaller groundrules. For example, the capacitance of a DRAM device is directly related to the area of the storage node. As DRAM devices are scaled to smaller dimensions, the corner rounding and shortening effects reduce the capacitance values which can be attained, and constrain the ability to scale the density of the DRAM array. In another example from DRAM, the overlap of a strap connection between storage node and diffusion areas can be limited by the rounding of strap and storage node during the lithographic process. The rounding of the strap and storage node pull the features away from each other so that they fail to intersect and make an electrical connection. In order to print the features large enough that the rounded corners intersect, an electrical short defect is created at other sections of the images where rounding and shortening effects are not observed, and the over-sized patterns fuse together.

Modeling has shown that a large percentage of the image shortening is due to mask corner rounding in the 64 Mb dynamic random access memory (DRAM) design, and becomes more pronounced for the 256 Mb DRAM design.

In the present era of very large scale integration and ultra large scale integration, new techniques are continuously being developed to more efficiently utilize the space within semiconductor devices while maintaining or improving present production efficiency.

As IC dimensions continue to shrink, printed lithographic features with minimal curvature are critical to achieve the packing density required to obtain the desired cell size.

The larger the curvatures on the images, the larger an area has to be allotted for two intersecting images. Therefore, printing of small rectangles with minimal foreshortening is becoming a difficult problem for the process fabricators as the dimensions of the structures become smaller.

Traditionally, masks have been fabricated with a single layer process in which a beam spot is rastered across an image to form a pattern. This technique inherently leads to corner rounding problems depending on the beam spot size. Smaller spots minimize the corner rounding problems, but these problems are solved at the cost of writing time and edge smoothness. Fore-shortening is also becoming an increasingly large problem at the mask level, as can be seen in FIG. 2.

What is known as the "k" factor is defined in the Rayleigh model for lithographic resolution, in the equation:

$$R = k\lambda/NA$$

where R is the resolution, k is an empirically derived parameter that is dependent on photoresist performance, $\lambda$ is the exposure wavelength, and NA is the numerical aperture of the expose tool. Presently, improving the "k" factor and reducing the wavelengths of the exposure have been the subject of much research, in order to improve resolution as feature size continues to decrease.

Issues relating to corner rounding and image foreshortening are becoming more acute as one uses lower "k" factor, i.e., lower fidelity lithography processes, in both the mask process and the wafer process in order to make increasingly smaller features. As is shown FIG. 2 in the new foreshortening data, as the design width decreases below 0.35 microns ($\mu$m) the foreshortening becomes more pronounced.

SUMMARY OF THE INVENTION

The present invention is a method of forming cornered images on a substrate comprising the steps of: (a) providing a substrate having a first layer of selectively etchable material thereon; (b) forming a plurality of parallel edged openings in the first layer of etchable material, the openings aligned to form par is of straight-edged first regions; (c) depositing a layer of selectively etchable material over the openings in said first layer of etchable material; (d) forming a second plurality of parallel edged openings in the layer of patternable material; said second plurality of openings intersecting adjacent pairs of said straight-edged first regions forming a plurality of second regions bounded by two edges of one of said first regions and two edges of one of said second region; and (e) processing the substrate in the second regions defined by said first and second openings.

In order to compensate for foreshortening problems, including curvature in the masks and printing on the wafers, the present invention provides a two-exposure method to decrease the amount of foreshortening in the photoresist. The present invention solves the problems related to image foreshortening by printing a first line in a first direction and a second line in a direction angularly offset from the first direction, thereby forming cornered images, typically rectangular or square-shaped images, at areas of intersection. The problems related to image foreshortening and corner rounding are either completely eliminated or reduced to a point where the printed image is acceptable within design parameters.

For example, the photomask of the present invention may be made using a standard, blank mask comprising a radiation blocking material, such as chrome, on a transparent substrate, such as fused silica or quartz, would be provided. Next, a hardmask material or other sacrificial layer that is relatively thin would be deposited over the entire surface. A first layer of a photoresist material is deposited, exposed to a first pattern, and developed on the surface of the hardmask in the manner commonly practiced in the art. The hardmask material is then etched, down to the chrome layer. The first layer of photoresist material is then stripped. A second layer of a photoresist material is deposited, a second pattern, having lines running in a second pattern, is aligned with the first pattern so that the lines of the second pattern angularly intersect with the lines of the first pattern. The second layer of photoresist material is exposed to the second pattern, and developed. The chrome is then etched down to the substrate. In this way, the foreshortening and curvature problems are minimized. Various alignment methods as well as phase-shifting structures may be utilized in conjunction with this method.

In another example, the present invention may include some features, such as deep trench (DT) capacitor structures and isolation trench (IT) structures, it is desirable to provide square shapes without foreshortening, especially as scaling and design constraints force these features to become smaller and smaller. In order to accomplish these goals, this example of the present invention provides three methods of forming square shapes for these features.

In the first of these exemplary methods, a grating pattern is used with a two-exposure process with a negative tone resist to form islands of square open areas separated by solid lines of resist. This process comprises the steps of: providing a substrate; depositing a first layer of resist; exposing the first layer of resist to a first pattern having lines in a first direction; developing the first layer of resist; depositing a second layer of resist; exposing the second layer of resist to a second pattern having lines in a second direction, orthogonal to the lines in the first pattern; developing the second resist; and etching the substrate. Optionally, a "memory layer" or thin sacrificial layer may be used to memorize the first lithographic pattern, allowing the stripping of the first resist. This alleviates topology and depth of focus issues with the second printing because the memory layer may be much thinner than a typical layer of resist as long as the etch rate ratios are favorable. Care must be taken with the alignment of the first and second layers. The etched open areas are the logical "OR" of the lithographic open areas.

In a second exemplary embodiment of the process for use with IT and DT features some areas are printed with the square or other angularly-cornered images, while other areas are protected, i.e., the material is selectively removed from the areas that will be angularly cornered by printing a first set of lines in a first direction, thereby removing a first layer of material in the exposed portions. A second set of lines in an angularly intersecting pattern is then printed. In the areas of intersection the material may then be etched to form square holes. The etched open areas are the logical "AND" of the lithographic open areas.

Typically, a silicon wafer substrate is provided. A first layers of polysilicon (polySi), silicon nitride and oxide typically tetraethylorthosilicate (TEOS), are deposited. These are the layers that need to be patterned.

Second, thin layers of polysilicon, silicon nitride and TEOS, respectively, are then layered onto the substrate surface to act as sacrificial masking layers. The order of the thin layers is chosen to be the same as the thick underlying layers, therefore allowing in situ stripping of the thin, masking layers. A first layer of resist is deposited, patterned, and the second layer of oxide is etched selective to the nitride. The first layer of resist is then stripped and a second layer of resist is deposited. The second layer of resist is then patterned with the lines running orthogonal to those of the first layer of resist. The exposed portions of the second layer of nitride is then etched, selective to both the second layer of polySi and the second layer of TEOS, thereby exposing portions of the second layer of polySi. This then forms the pattern to be selectively etched all the way into the substrate by etching each subsequent sharply-cornered area selective to the other materials.

In a third exemplary embodiment of the process for use with IT and DT features, the first and second layers do not form a complete grating pattern. The additional layers are incorporated to form a non-grating or "dog bone" pattern, which is used for the second pattern to guarantee cornered shapes.

In these manners, cornered images with fewer problems with respect to corner rounding and image foreshortening are produced.

BRIEF DESCRIPTION OF THE DRAWINGS

For an understanding of the nature and objects of the present invention, reference should be made to the following detailed description taken in connection with the accompanying drawings wherein:

FIG. 7 is a top-down schematic of a third step in the process for producing a photomask in accordance with the first embodiment of the present invention;

FIG. 8 is a cross-sectional schematic across line 8—8 of FIG. 7;

FIG. 9 is a top-down schematic of a fourth step in the process for producing a photomask in accordance with the first embodiment of the present invention;

FIG. 10 is a cross-sectional schematic across line 10—10 of FIG. 9;

FIG. 11 is a cross-sectional schematic across line 11—11 of FIG. 9;

FIG. 12 is an alternative cross-sectional schematic across line 11—11 of FIG. 9;

DETAILED DESCRIPTION OF THE INVENTION

In a first embodiment of the present invention, a first layer of photoresist is used to photolithographically define a pattern of lines in a first direction in an optional sacrificial layer. The term "define" as used herein includes: exposing and developing the photoresist; etching the layer beneath the photoresist; and stripping the photoresist from the surface. Next, a second photoresist layer is used to photolithographically define a plurality of lines running in a direction angularly offset from those in the first direction, while leaving the resist protected portions of the sacrificial layer material in place. The substrate is then etched and open square areas of varying sizes, i.e., with independently determined lengths and widths, are formed. In this manner, the logical "OR" of the two-step lithographic procedure is etched.

Alternatively, the pattern of lines could merely be defined in the first photoresist layer without utilizing a layer of a sacrificial material, however this would be subject to more issues with respect to depth of focus and topology. The second photoresist layer could be defined as described above. Then the pattern formed by the first photoresist material and the second layer of photoresist material could be used as a mask to etch into the substrate.

The following example is presented for the purposes of illustration only, and are not intended to be limiting as many other possibilities would be obvious to one skilled in the art.

The invention results in lithographically square images—that is, images in a transfer film (such as photo resist or polyimide) having sidewalls that intersect at sharp-edged corners (i.e. corners without significant corner rounding and/or images without significant image foreshortening) in which at least one portion of the image is at or near the resolution limit of the photoexposure tool. Using conventional directional etching techniques, these images in a transfer film (such as photoresist or polyimide) are then transferred to underlaying semiconductor layers. As a result, sidewalls that intersect at approximately ninety degrees can be defined in these layers, to create a host of structures (e.g. contact vias interconnecting a metal line to another metal line or to a doped silicon structure such as doped polysilicon or a source/drain diffusion; a .pillar. of doped semiconductor to define an electrode of a DRAM cell; or an aperture through a photomask) having sharp-edged corners

EXAMPLE 1

To produce an acceptable photomask, having features with sharp, 90° angles at the corners a first adaptation or embodiment of the present invention is utilized. A grating pattern is used with a two-exposure process with a negative tone resist to form islands of square open areas separated by solid lines of resist.

Figure 4:
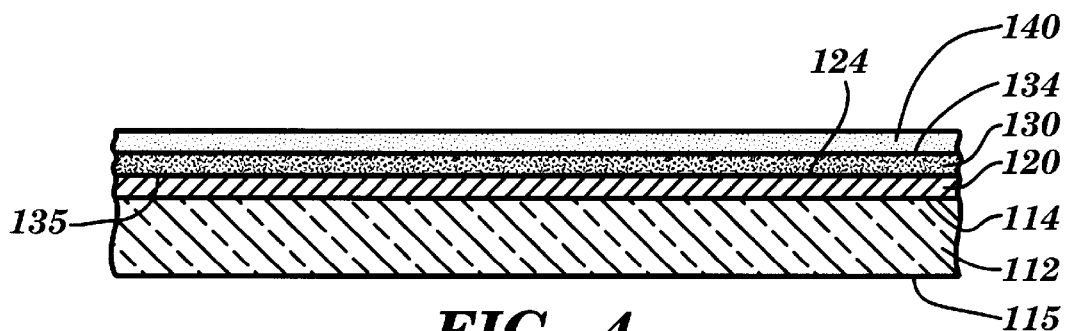
FIG. 4 is a cross-sectional schematic across lines 4—4 of FIG. 3.

As shown in FIG. 4, a substrate 112 having a top surface 114 and a bottom surface 115 is provided. The substrate 112 is made from a material that will transmit electromagnetic radiation or other suitable actinic energy of the wavelength used in lithography (hereinafter "actinic radiation"), i.e., e-beams, ion beams, or optical radiation, typically having wavelengths in the range from about 190 to about 450 nanometers (nm). Fused silica is the preferred material for substrate 112, although other materials having a suitable refractive index and other characteristics may also be used. The thickness of substrate 112 will vary based on known design considerations. However, in one embodiment of the present method, the substrate has a thickness of about 2–7 millimeters (mm).

Top surface 114 is covered with a blocking layer made from a material 120 having an upper surface 124 that substantially blocks the transmission therethrough of electromagnetic radiation of the predetermined range of wavelengths. Suitable materials for blocking layer 120 include those that have mechanical durability and opacity in thin layers, for example: chromium, molybdenum, aluminum, tungsten, titanium, molybdenum silicide, or carbon. Chromium is the preferred material for layer 120 due to its relatively high mechanical and chemical durability and because there is a large installed base of sophisticated chromium mask repair tools. The specific thickness of blocking layer 120 will vary as a function of the ability of the material used as the layer to block the transmission of radiation. However, when layer 120 is made from chromium, it is preferred that the layer have a thickness ranging from about 1 nm to about 1,000 nm with a thickness of about 100 nm being preferred.

A layer of hardmask material 130 having a first surface 134 and a second surface 135 is deposited on the upper surface 124 of the blocking layer 120. This hardmask material is used as the etch mask for underlying layers. The thickness of this layer is chosen by etch rate ratio to the underlying layers. The hardmask material is typically a layer of either silicon nitride or silicon dioxide. For the purposes of discussion herein, the hardmask material will be referred to as the "nitride layer 130" although it is recognized that other materials could have been chosen.

Figure 1:
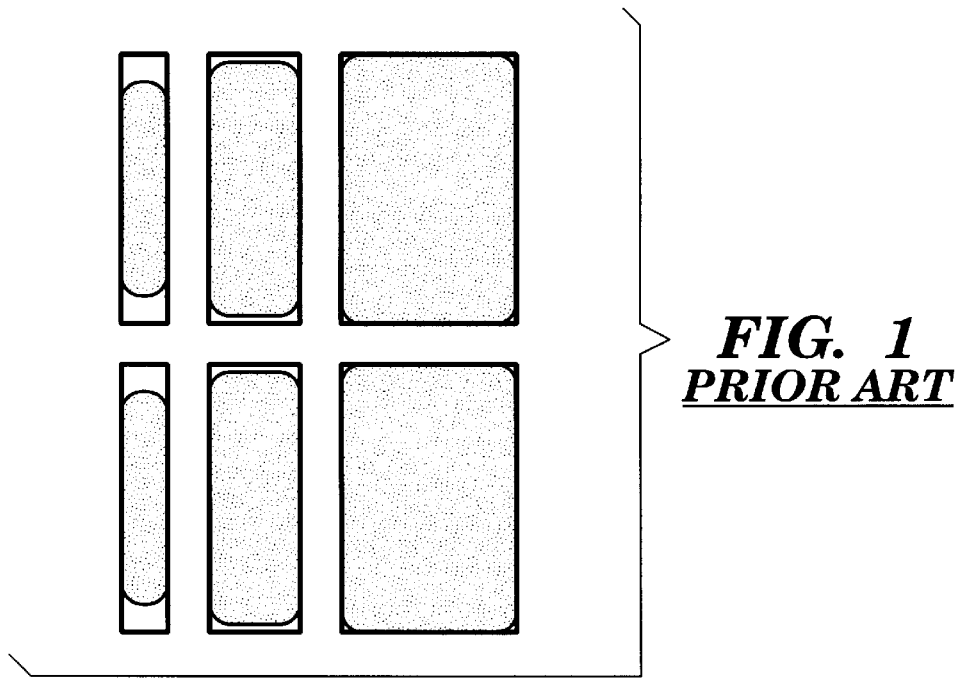
FIG. 1 is a schematic of image foreshortening in lithographic printing of square shaped images.
Figure 2:
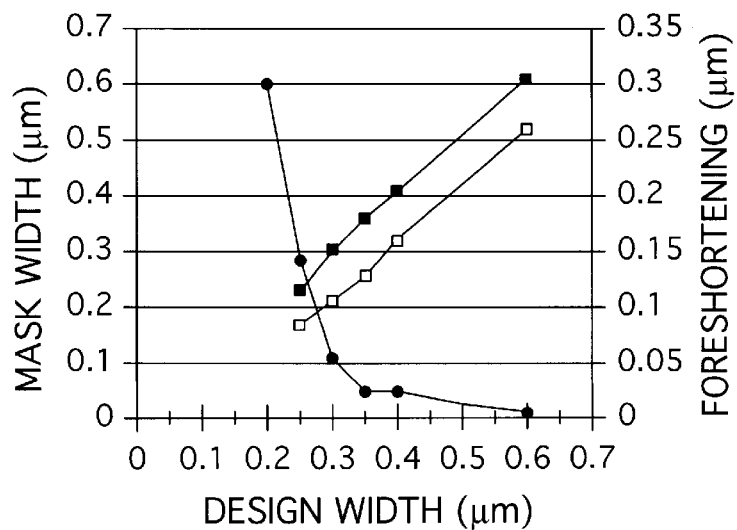
FIG. 2 is a graphical representation of the problem of image foreshortening as a function of dimension.
Figure 3:
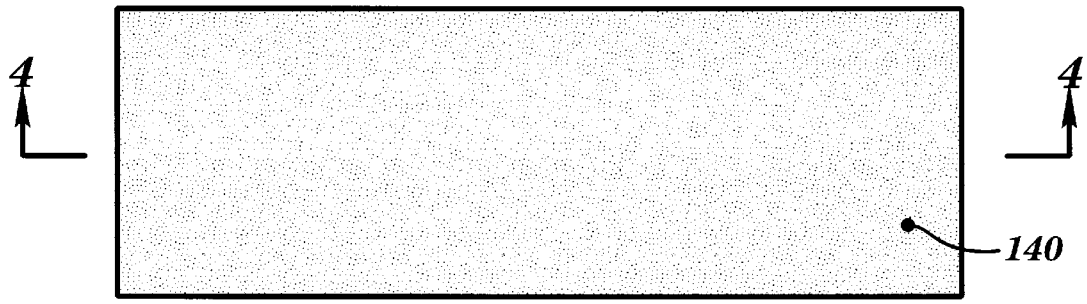
FIG. 3 is a top-down schematic of a first step in a process for producing a photomask in accordance with a first embodiment of the present invention.

A layer of a first photoresist material 140 is then deposited on the first surface 134 of the nitride layer 130, and the resultant structure is shown in FIG. 3. The first photoresist material is a material that selectively reacts when exposed to light, thereby changing the solubility characteristics of the material to either increase the solubility in areas that have been exposed to the actinic energy source (positive tone) or decrease the solubility (negative tone). In this particular example, the choice of positive or negative tone resist is immaterial, the resist characteristics with regard to processing conditions and sharpness of features being determinative. The photoresist material 140 is then exposed and developed in a manner commonly known in the art. The entire structure is etched and the resist is stripped to form the structure shown in FIG. 5. The process of exposing and developing the photoresist material, etching the structure and then stripping the resist material will hereinafter be referred to as "defining" the desired features.

Figure 5:
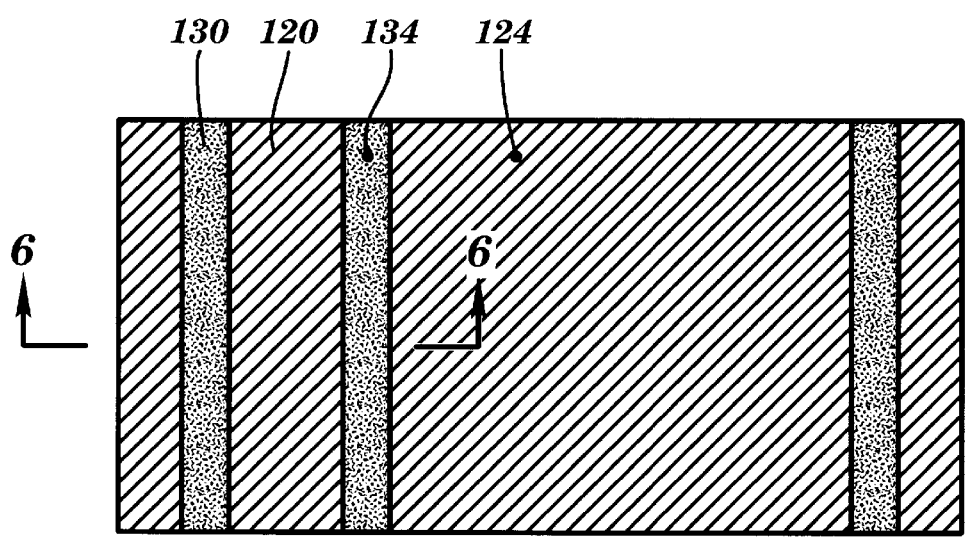
FIG. 5 is a top-down schematic of a second step in the process for producing a photomask in accordance with the first embodiment of the present invention.
Figure 6:
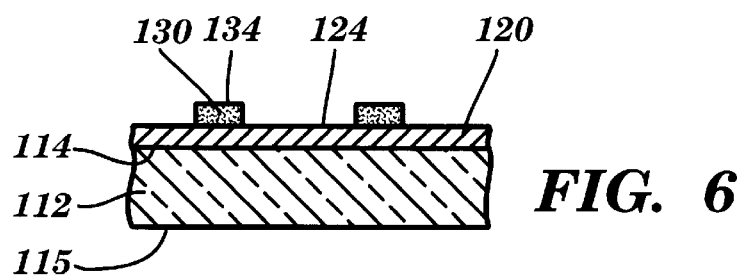
FIG. 6 is a cross-sectional schematic across line 6—6 of FIG. 5.

As shown in FIG. 5, the features are usually lines running in a first direction. In this case they are oriented in a north-south direction. As shown in FIG. 6, there are areas from which the nitride layer has been completely removed, exposing the upper surface 124 of the blocking material 120 and areas in which the nitride layer 130 remains, these being the areas that were protected by the photoresist during the etching step.

A second layer of photoresist 150 is then deposited, exposed and developed to form the structure depicted in FIG. 7. Lines of photoresist material 150 are formed running orthogonally to the lines of nitride 130. Portions of the layer of blocking material 120 are exposed on the upper surface 124. The exposed portions have square corners, without the corner rounding or fore-shortening problems typically associated with square features. As shown in FIG. 8, the lines of photoresist 150 are on the upper surface 124 of the layer of blocking material 120.

The exposed portions of the layer of blocking material 120 are etched down to the top surface 114 of the substrate 112. The photoresist is then stripped, and the final mask 160, as shown in FIG. 9, is produced. As shown in FIG. 9, the lines of blocking material 120 run east-west and lines having a hardmask material on the surface run north-south. As shown in FIGS. 10 and 11, the lines of blocking material simply lie on the top surface 114 of the substrate 112. As shown in FIG. 12, rim-type phase-shifters may be formed by non-directionally etching edges 122 of the lines of blocking material 120. Because the edges are pulled back from the edge of the hardmask material 130, the layer of hardmask material may function as a rim-type phase shifter as long as the over etch process is carefully controlled to create the proper pull-back distance, depicted as distance Y in FIG. 12.

In a second embodiment of the present invention, the areas that are to be made angularly cornered are the areas where both the first etching step and the second etching step overlap. The areas of overlap may be considered the logical "AND" areas. This embodiment utilizes a first sacrificial layer and a second sacrificial layer to obtain the sharply cornered image in the underlying layer or layers. A first pattern of lines running in a first direction is etched into the first sacrificial layer of material. Then, a second pattern of lines is defined and etched into the second layer of sacrificial material. The etching of the second layer must be selective to both the resist material, the material under the second sacrificial material (if any) and the first sacrificial layer of material. For example, if a polysilicon layer is going to be patterned, a first layer of silicon nitride may be the first layer of sacrificial material and a second layer of silicon oxide may be the second layer of sacrificial material. The nitride layer could then be patterned into lines and spaces. Through the spaces, the oxide layer would be exposed. Next, another photolithographic step would be used to pattern the resist and wherever the spaces in the resist pass over the nitride lines, the nitride would remain, however, wherever the spaces in the second resist pass over areas of spaces in the nitride layer, the oxide beneath would be exposed, and therefore, could be selectively etched to the layer of polyimide beneath.

Certain constraints exist in choosing the thicknesses of the various layers. For example, the depth of focus and other lithographic constraints require that the layers be fairly planar when printed. For that reason, the preferred embodiments of the present invention choose to utilize additional, thin layers (and therefore additional processing complexity and costs) in order to print the second set of lines with accuracy even though the surface is either not completely planar or the resist thickness varies.

Other constraints exist in determining which layers may be placed where as well as how thick they must be. For example, certain materials will etch in the same etchants, however, they etch at different rates. So, in order to selectively etch through, say the nitride layer, the layer beneath it must not be etched at the same rate as the nitride in the chosen etchant, or the layer beneath (or above) must be made thicker to compensate for the etching rates. The following examples are in no way meant to be limiting, but are exemplary of the basic concepts introduced by this invention.

EXAMPLE 2

In a second embodiment of the process for use with features to be printed on wafers, for example DT features, some areas are printed with the square shaped images, while other areas are protected.

In the first of these methods, a grating pattern is used with a two-exposure process to form islands of square open areas separated by solid lines of resist. More specifically, a substrate is provided, typically a P-type silicon wafer.

The wafer is preferably coated with a negative tone resist, for example, poly(3-hydroxystyrene), available from Hoechst Celanese of Corpus Christi, Tex., poly(4-hydroxystyrene), poly(4-hydroxystyrene) with one or more alkyl substituents on the aromatic ring, poly(3-hydroxystyrene) with one or more alkyl substituents on the aromatic ring, or any of these as the major subunit in a copolymer, such as PHM-C, commercially available from Maruzen America of New York, N.Y.

This negative tone resist is then exposed under appropriate exposure conditions to cause lines in either the x-direction or the y-direction to be formed upon developing. One of two processes may then be implemented. The negative tone resist may be exposed in the opposite direction, and subsequently both the first set of lines and the second set of lines may be developed or the first set of lines may be developed and the entire surface of the wafer is again coated with a second layer of negative tone photoresist material and then exposed to the appropriate actinic energy source under the appropriate conditions to form a second set of lines that run orthogonal to the first set of lines. That is, if the first set of lines run in the x-direction, then the second set of lines will run in the y-direction and vice versa. In this manner, a grid-like pattern of resist is formed, leaving square areas of substrate surface exposed. The substrate may then be processed, i.e., etched, implanted, etc., using the square mask for the pattern and then the resist is removed to form a final product with square features. Care must be taken with the alignment of the first and second layers. When square images are printed using two separate reticles, an alignment concern for the alignment of subsequent mask patterns to this initial pattern is created: from the two initial masks, which one is chosen to align to in subsequent processing? This creates a concern, because obtaining first-order alignment to the square image pattern in both X and Y axes is often desirable. This concern can be addressed by the use of a specific alignment procedure at the subsequent levels. This procedure involves viewing the alignment marks from both of the patterns used to make the square images. After collecting alignment data from both sets of marks, the software in the photo-tool can be used to extract the optimum X parameters from one mask level, and the optimum Y parameters from the next level, and use this information to establish the optimum alignment parameters for the subsequent level. For a photo-tool such as a Nikon, which uses two separate marks for X and Y on each level, this would be easy to implement. For a photo-tool such as a Micrascan, which uses a single 45 degree chevron as the alignment mark, this information can be extracted, but requires that a software program be written.

Figure 13:
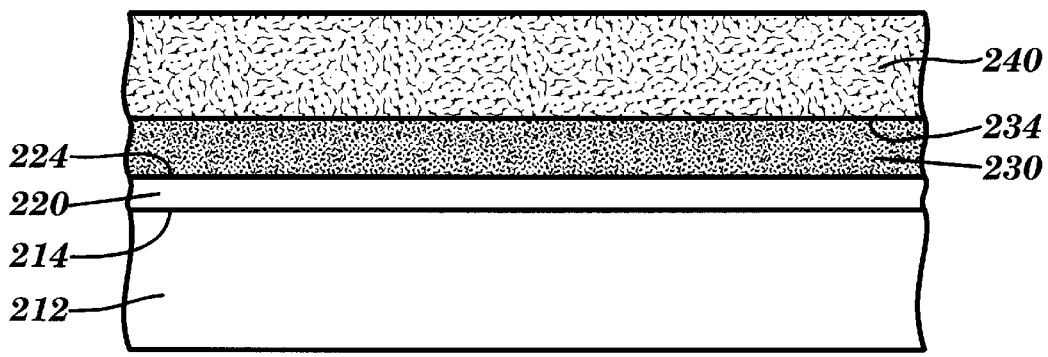
FIG. 13 is a cross-sectional schematic of a first step in a second embodiment of the present invention.

As shown in FIG. 13, a silicon wafer substrate 212 having an upper surface 214 is provided. A first layer of polysilicon 220 (polySi) is deposited on the upper surface 214 of the substrate 212. Then, a first layer of silicon nitride 230 is deposited on the upper surface of the polySi 224. A first oxide layer 240, typically using tetraethyl-orthosilicate (TEOS) is deposited on an upper surface of the first silicon nitride layer 234. These layers are chosen so there is an acceptable etch rate ratio between them.

Figure 14:
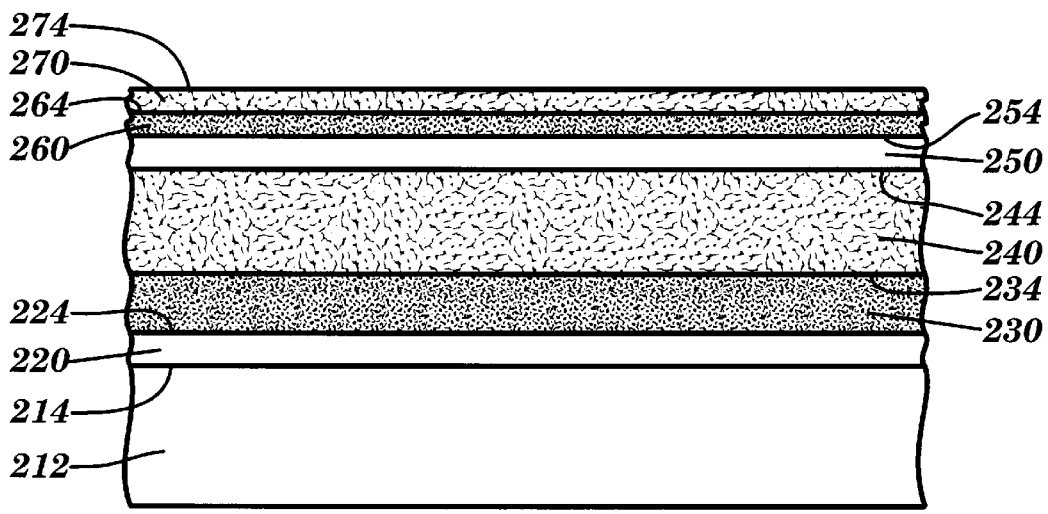
FIG. 14 is a cross-sectional schematic of a second step in a second embodiment of the present invention.
Figure 15:
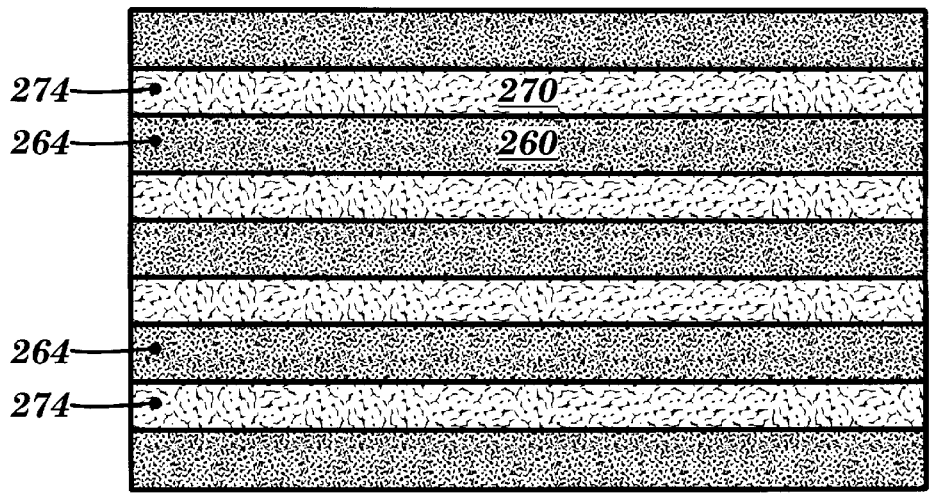
FIG. 15 is a top-down schematic of a third step in a second embodiment of the present invention.
Figure 16:
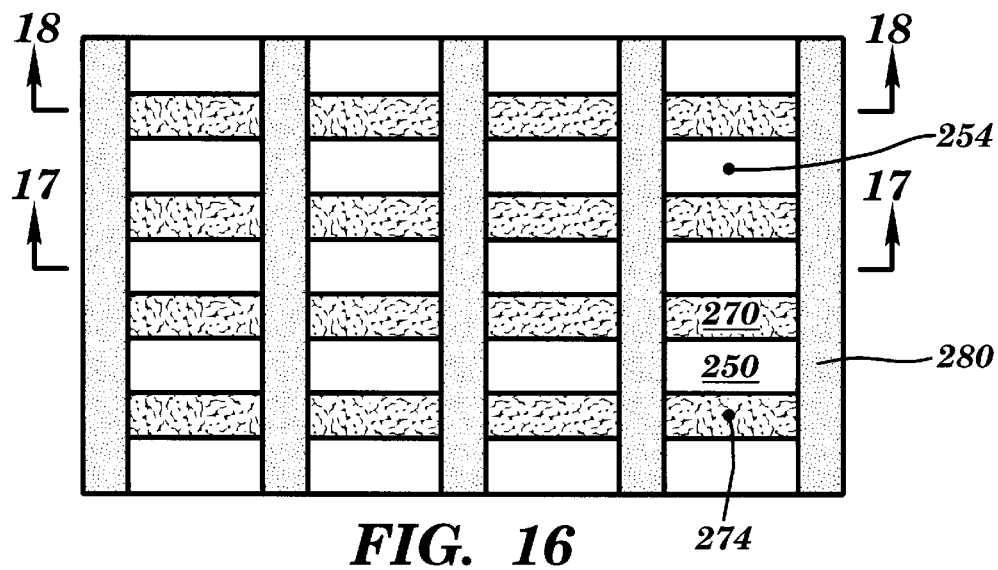
FIG. 16 is a top-down schematic of a fourth step in a second embodiment of the present invention.
Figure 17:
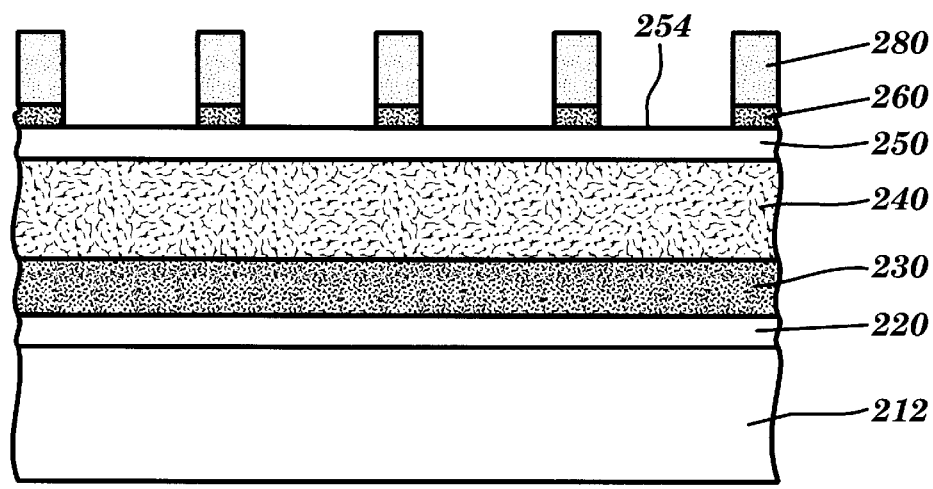
FIG. 17 is a cross-sectional schematic taken across line 17—17 of FIG. 16.
Figure 18:
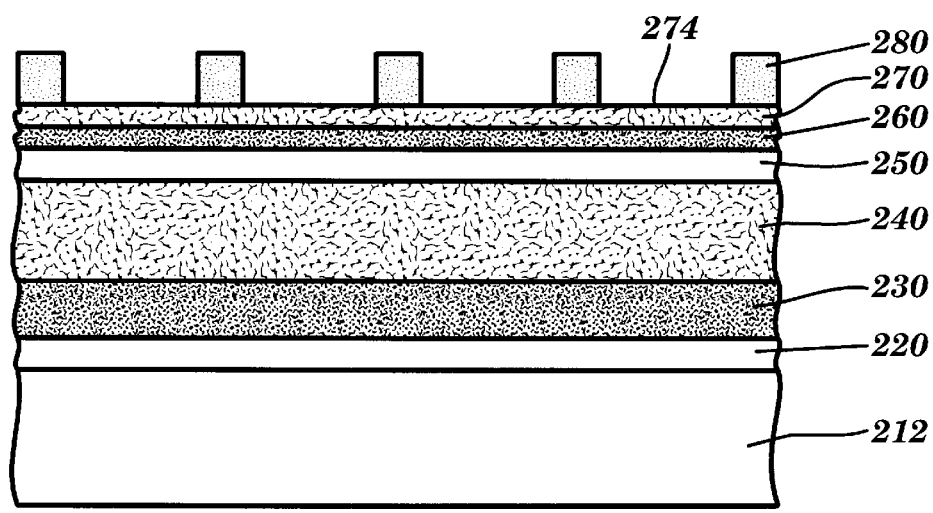
FIG. 18 is a cross-sectional schematic taken across line 18—18 of FIG. 16.

As shown in FIG. 14, a second or thin layer of polySi 250 is then deposited to a thickness of about 500 Å to about 1000 Å, and preferably 750 Å on an upper surface of the first oxide layer 244. The second layer of polysilicon 250 is deposited to a thickness less than the first layer of polysilicon 220. A second or thin layer of silicon nitride 260 is deposited to a thickness of about 500 Å to about 1000 Å and preferably about 750 Å on an upper surface of the second polySi layer 254 and then a second, thin layer of TEOS 270 is deposited to a thickness of about 750 Å on an upper surface of the second nitride layer 264. The second layer of silicon nitride 264 is deposited to a thickness less than the first layer of silicon nitride and the thickness of silicon dioxide is in the range of about 500 Å to about 1000 Å. The second layer of silicon oxide is deposited to a thickness less than the first layer of silicon oxide. A first layer of resist (not shown) is deposited on an upper surface of the second TEOS layer 274, exposed in lines running in either the x-direction or the y-direction, and developed to expose portions of the upper surface of the second TEOS layer. As shown in FIG. 15, the exposed upper surfaces 274 of portions of the second layer of oxide 270 are etched selectively to the upper surface 264 of the second layer of nitride 260. The first layer of resist is then stripped and a second layer of resist (280 in FIG. 16) is deposited. The second layer of resist is then exposed in a pattern with the lines running orthogonal to those of the first layer of resist, i.e., in either the x-direction or the y-direction, whichever the first layer of resist was not, and developed, thereby exposing portions of the upper surface 274 of the second layer of oxide 270 and portions of the upper surface 264 of the second layer of nitride 260. The exposed portions of the second layer of nitride 260 are then selectively etched, so that neither the second layer of polySi 250 nor the second layer of TEOS 270 are etched, thereby exposing portions of the upper surface 254 of the second layer of polySi 250, as shown in FIGS. 16–18. As shown in FIG. 16, the resist runs in lines that are orthogonal to the lines created in the first etching step, which are the areas that have been etched down to the upper surface of the polySi 254. As shown in FIG. 17, the areas that are etched down to the upper surface 254 of the second layer of polySi 250 are the areas that no longer include any of the second, thin layer of TEOS 270. As shown in FIG. 18, the thin layer of oxide 270 protects the second layer of nitride 260 from being etched, even in areas where the upper surface 274 of the second layer of oxide 274 is exposed, i.e., not covered by resist 280.

Figure 19:
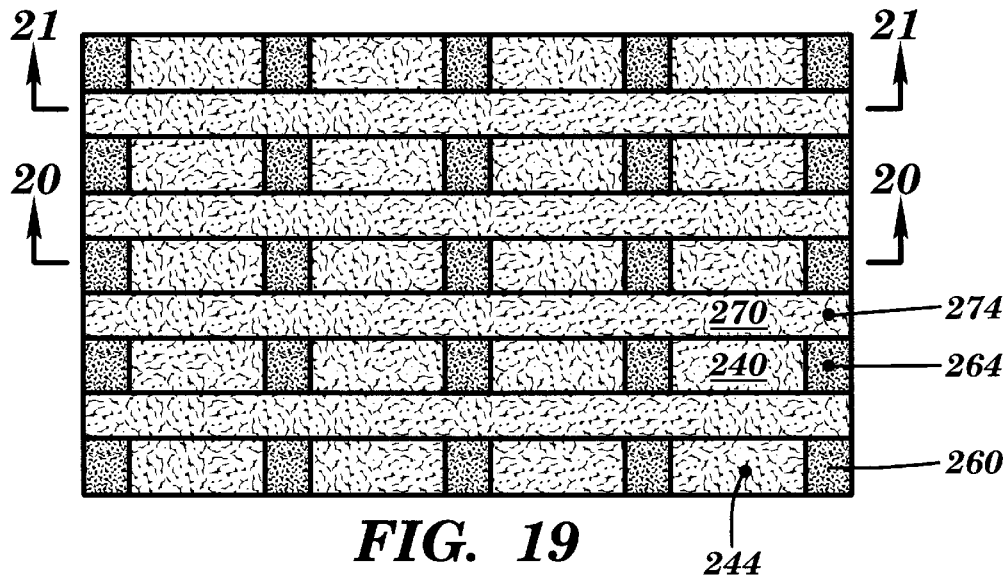
FIG. 19 is a top-down view of a fifth step in a second embodiment of the present invention.
Figure 20:
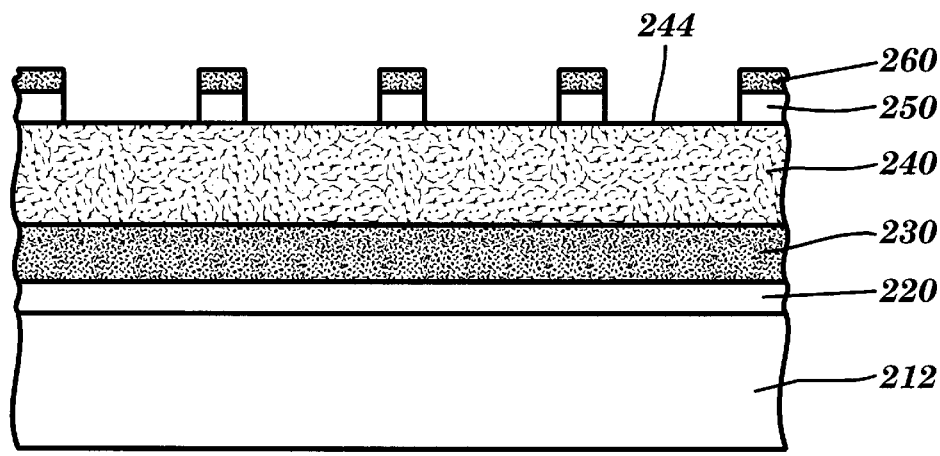
FIG. 20 is a cross-sectional schematic taken across line 20—20 of FIG. 19.
Figure 21:
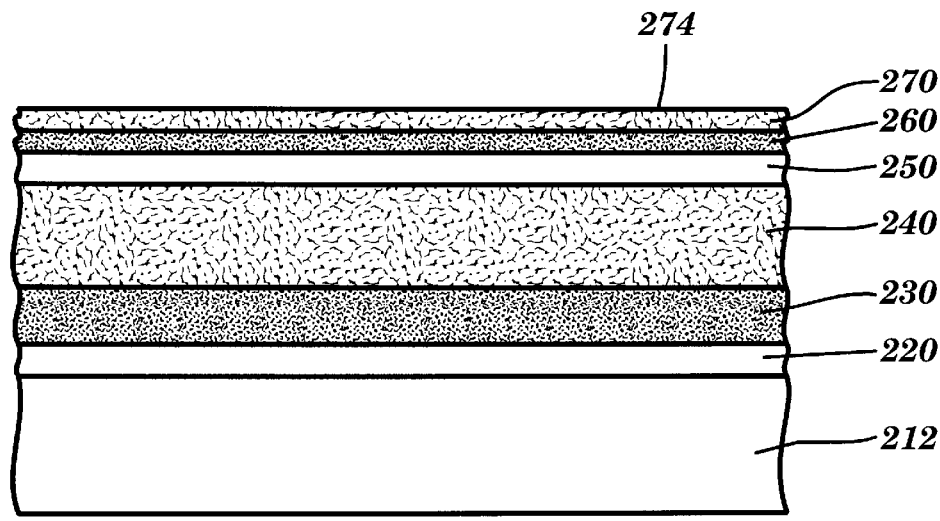
FIG. 21 is a cross-sectional schematic taken across line 21—21 of FIG. 19.

As shown in FIG. 19, the resist is then stripped and the exposed portions of the second layer of polySi 250 are selectively etched, thereby exposing portions of the upper surface of the first layer of TEOS 244. As shown in FIG. 20, the second layer of nitride 260 acts as a mask material and is not etched. The first layer of TEOS 240 is also not etched. As shown in FIG. 21, the second layer of TEOS 270 is not etched.

Figure 22:
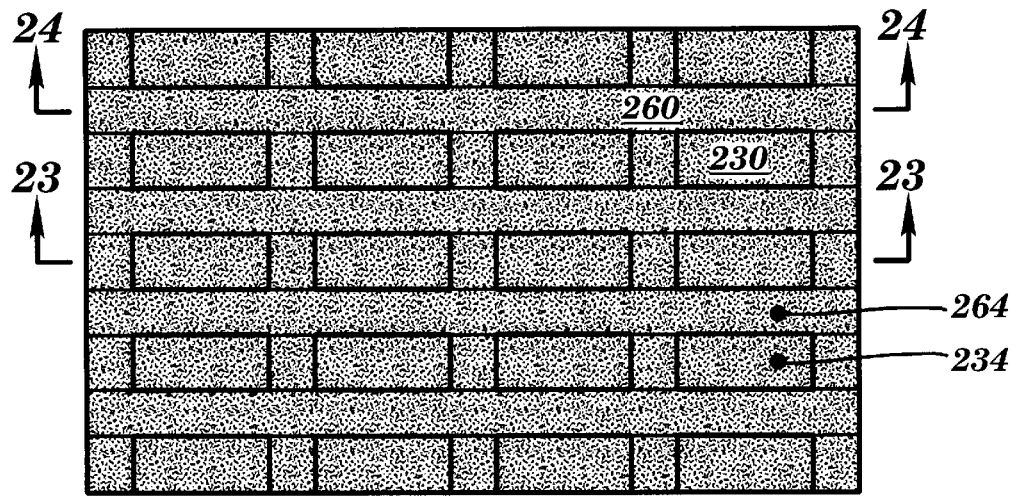
FIG. 22 is a top-down view of a sixth step in a second embodiment of the present invention.
Figure 23:
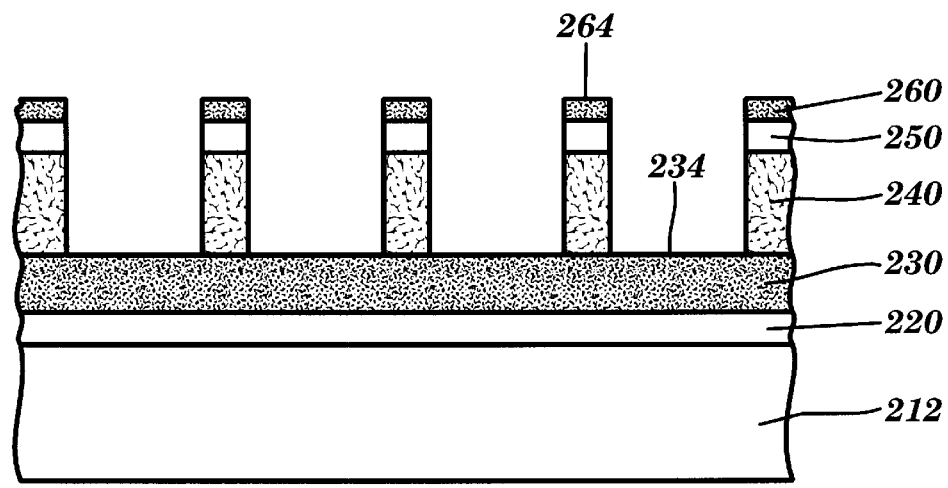
FIG. 23 is a cross-sectional schematic taken across line 23—23 of FIG. 22.
Figure 24:
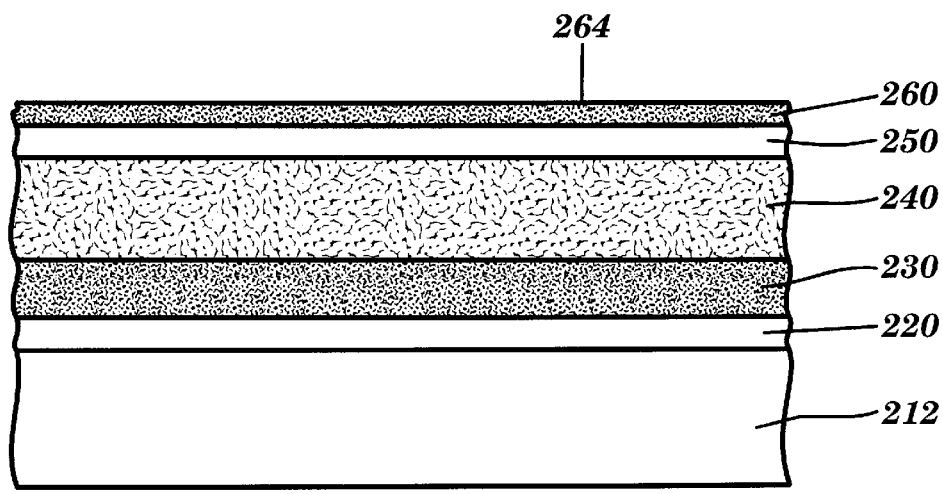
FIG. 24 is a cross-sectional schematic taken across line 24—24 of FIG. 22.

As shown in FIG. 22, the first and second layers of TEOS, 240, 270, are selectively etched, thereby exposing the upper surfaces 234 and 264 of the first and second nitride layers, 230 and 260, respectively. As shown in FIG. 23, the upper surface 234 of the first layer of nitride 230 is exposed, in addition to the upper surface 264 of the second layer of nitride 260, which was exposed in the previous step. As shown in FIG. 24, the upper surface 264 of the second layer of nitride 260 is exposed in the areas that were previously covered by the second layer of oxide 270 (shown in FIG. 19). At this point the grating pattern of square shapes has then been formed, however, it is located above the surface in which it is necessary to form the grating.

Figure 25:
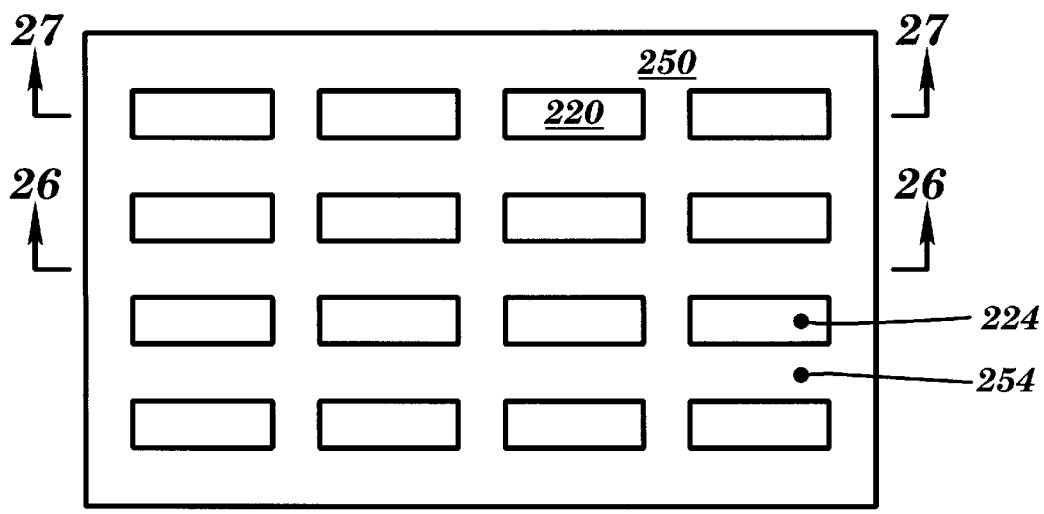
FIG. 25 is a top-down view of a seventh step in a second embodiment of the present invention.
Figure 26:
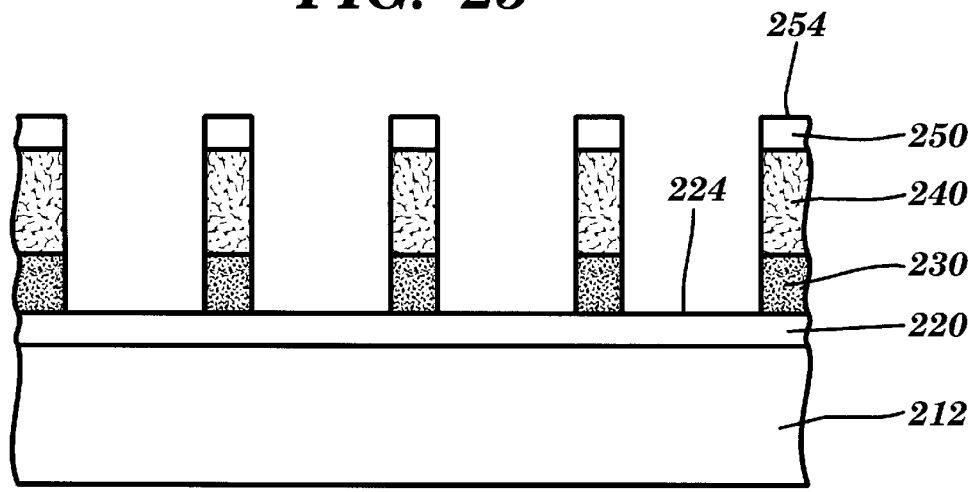
FIG. 26 is a cross-sectional schematic taken across line 26—26 of FIG. 25.
Figure 27:
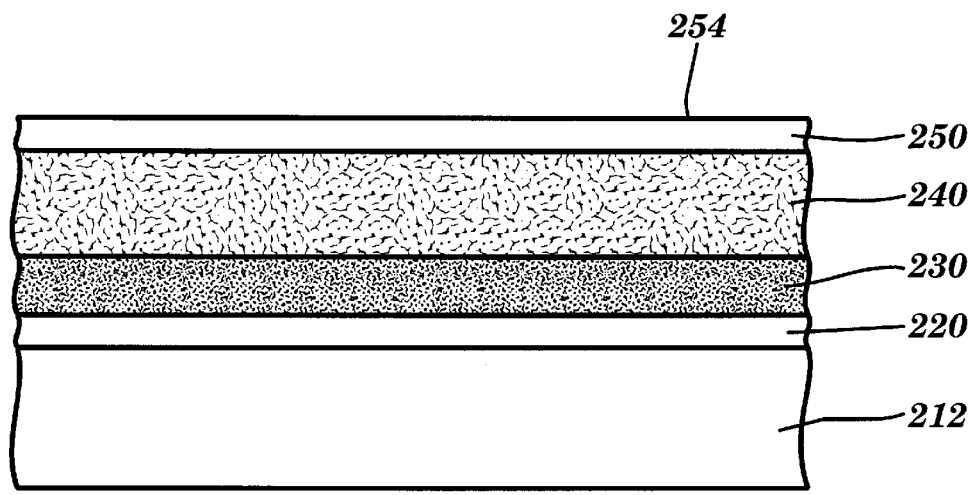
FIG. 27 is a cross-sectional schematic taken across line 27—27 of FIG. 25.

The first and second nitride layers 230 and 260 are then etched down to the first and second polySi layers, 220 and 250, respectively, underneath. As shown in FIG. 25, and in cross-section in FIGS. 26 and 27, the upper surface 224 of the deposited polySi layer 220 is thereby exposed in areas. The top layer on the remainder of the surface is the second, thin layer of polySi 250. As shown in FIG. 26, wells 290 have been formed that have the upper surface 224 of the deposited layer of polySi 220 as a bottom. As shown in FIG. 27, the upper surface 254 of the second layer of polySi is exposed, however, the first layer of polySi 220 remains protected.

Figure 28:
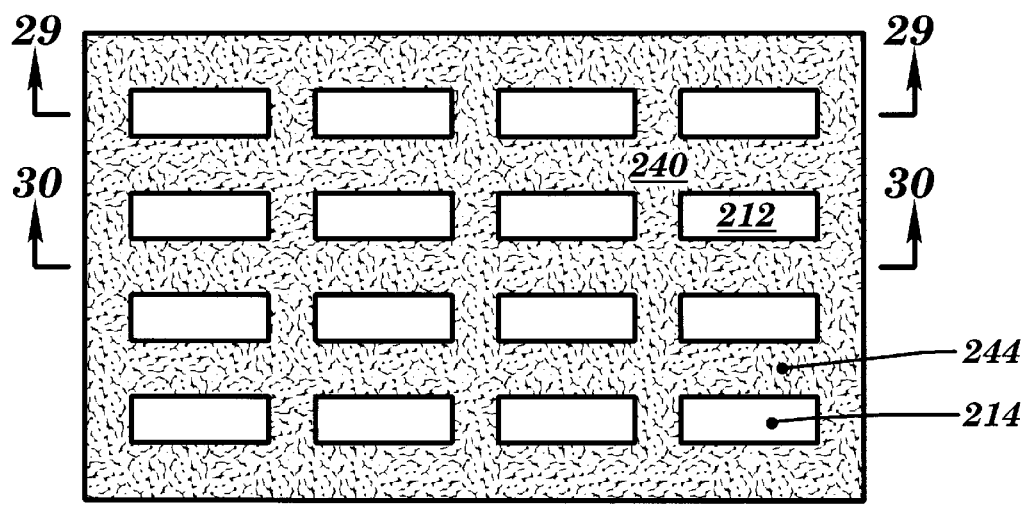
FIG. 28 is a top-down view of an eighth step in a second embodiment of the present invention.
Figure 29:
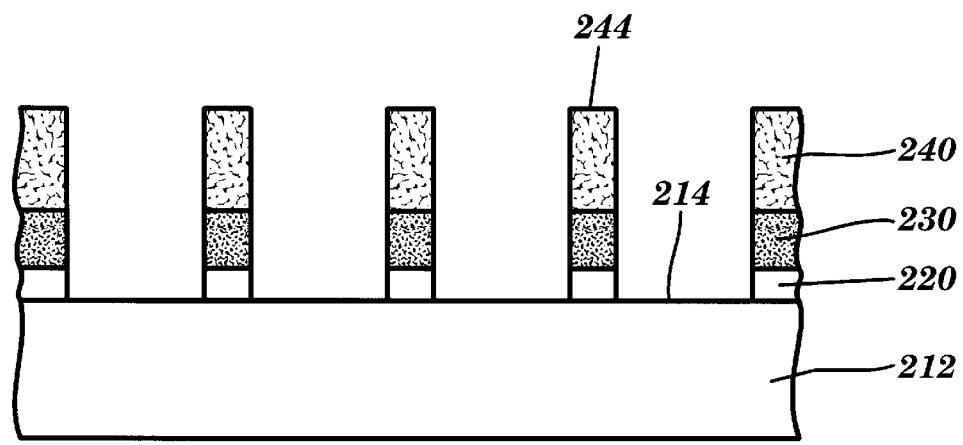
FIG. 29 is a cross-sectional schematic taken across line 29—29 of FIG. 28.
Figure 30:
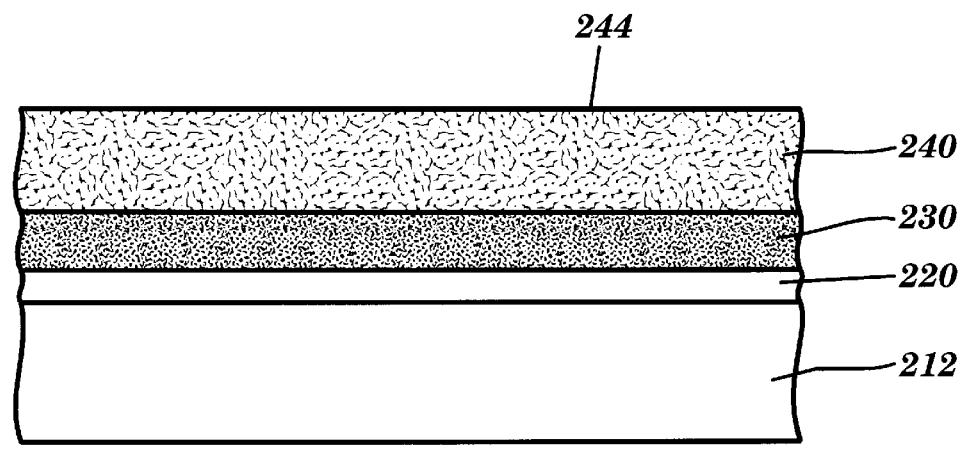
FIG. 30 is a cross-sectional schematic taken across line 30—30 of FIG. 28.

All polySi, both the first or deposited layer 220 and the second layer 250, is then selectively etched to oxide, so that the first layer of oxide 240 is not removed from the areas where it is desired, as shown in FIG. 28, and in cross-section in FIGS. 29 and 30. As shown in FIG. 29, areas of the wafer surface 214 are exposed for the remaining processing steps, which are well known in the art, while other areas are covered by the first layers of polySi, nitride and oxide, 220, 230, and 240.

EXAMPLE 3

In deep trench (DT) capacitor structures, it is desirable to provide square shapes without foreshortening, especially as scaling and design constraints force these features to become smaller and smaller. In order to accomplish these goals, the present invention provides a third embodiment of a method for forming square shapes for these features.

In this third embodiment for the process for use with IT features, the first and second layers do not form a complete grating pattern. A non-grating or "dog bone" pattern is used for the second pattern to guarantee square shapes. The pattern is formed in the following manner.

Figure 31:
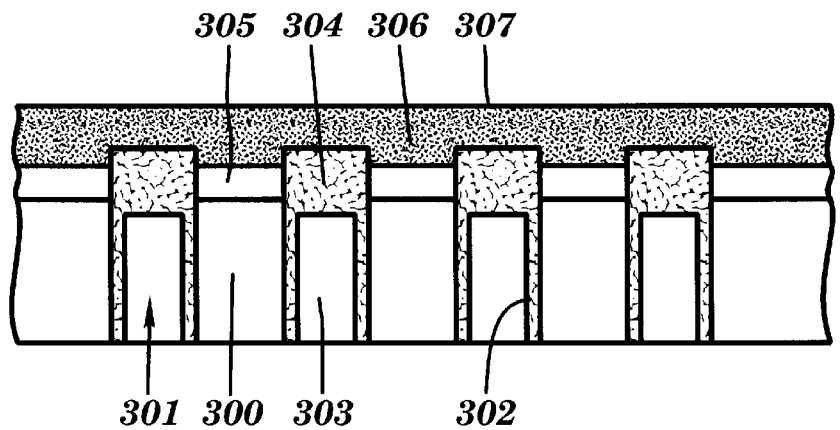
FIG. 31 is a cross-sectional schematic of a first step in a third embodiment of the present invention.

As shown in FIG. 31, a proposed 1 Gb PAD structure is depicted having deep trench ("DT") structures 301 previously formed in a silicon wafer 300. The DT's are formed in the usual manner, by etching them out, depositing a collar oxide layer 302, and then filling the trench with polysilicon 303. An oxide plug 304 is formed at the surface of the polysilicon 303. A layer of gate polysilicon 305 is on the surface of the wafer 300 and a layer of an oxide 306 covers the entire surface. On an upper surface of the oxide 306 is a layer of nitride 307.

Figure 32:
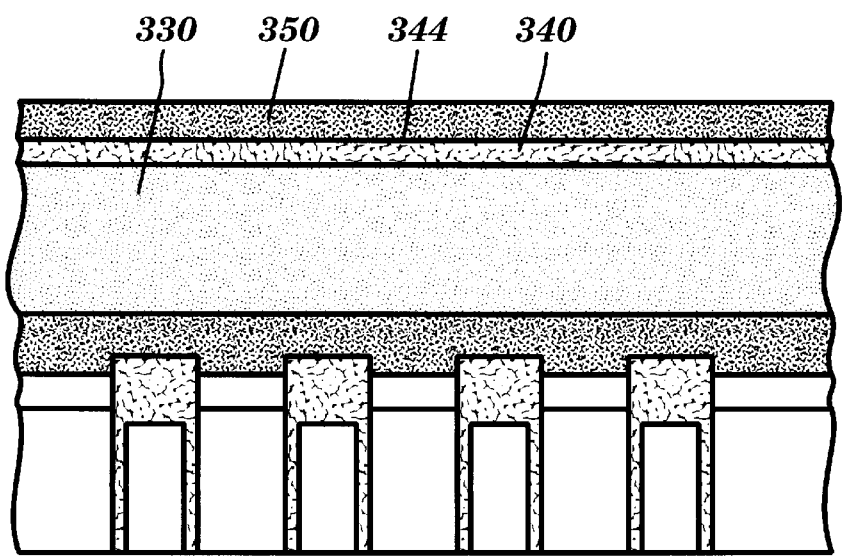
FIG. 32 is a cross-sectional schematic of a second step in a third embodiment of the present invention.
Figure 33:
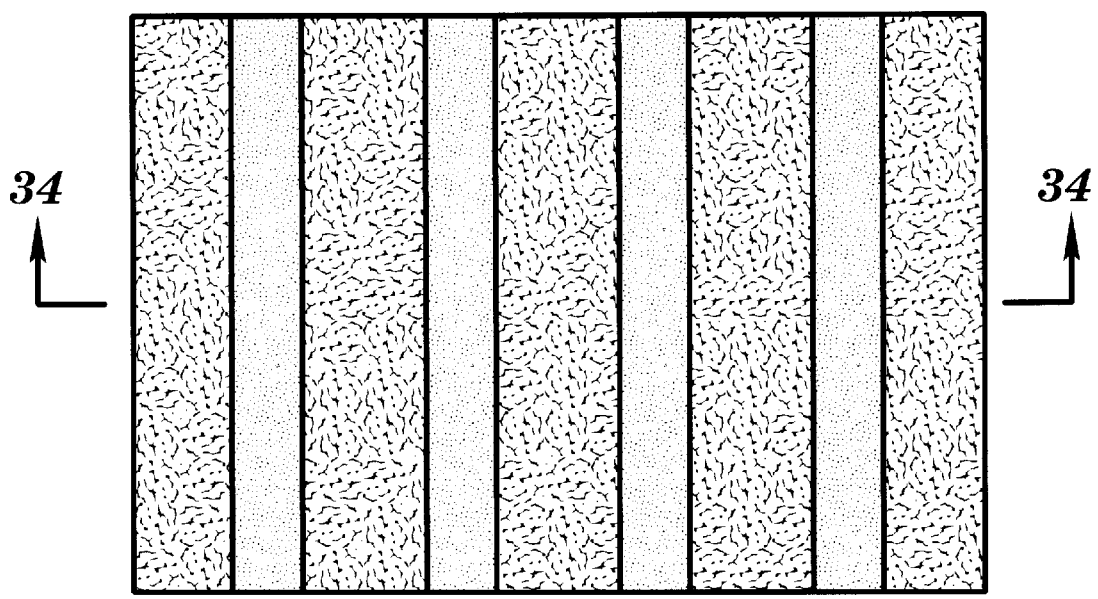
FIG. 33 is a top-down view of a third step in a third embodiment of the present invention.
Figure 34:
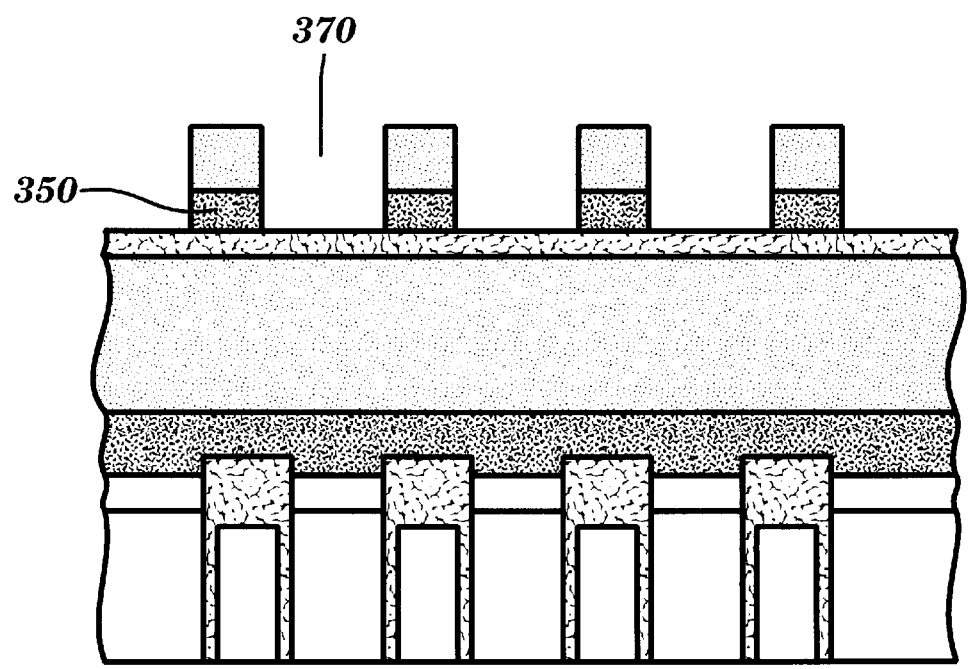
FIG. 34 is a cross-sectional schematic taken across line 34—34 in FIG. 33.

As shown in FIG. 32, a layer of organic material 330, for example, polyimide, is deposited on an upper surface 314 of the nitride 307. The polyimide is applied by a spin coating to a thickness in the range of about 0.4 microns ($\mu$m) to about 1 $\mu$m. It should be noted that the thicknesses of this layer and all subsequent layers are driven by etch rate ratios. It is then hard baked at a temperature in the range of about 170° Celsius (C) to about 220° C. for about 1 hour. After the layer of polyimide has been completely processed, a thin layer of an oxide 340, preferably TEOS, is deposited to a thickness in the range of about 500 Å to about 750 Å, preferably about 750 Å. Next, a layer of silicon nitride 350 is deposited on an upper surface 344 of the layer of TEOS. A first layer of a resist material 360, which is preferably a positive tone type of resist, is deposited on an upper surface 354 of the layer of nitride. The resist is exposed and developed in a regular grating pattern having lines running along either an arbitrary x-axis or y-axis. For discussion purposes, the lines are formed in the y-direction and the cross-sectional schematics are taken across a line such as across line 34—34 in FIG. 33. Thus, portions of the upper surface 354 of the layer of nitride are exposed. Next, the nitride layer 350 is etched selective to TEOS to form channels 370, as shown in FIG. 33. Then the resist is stripped.

Figure 35:
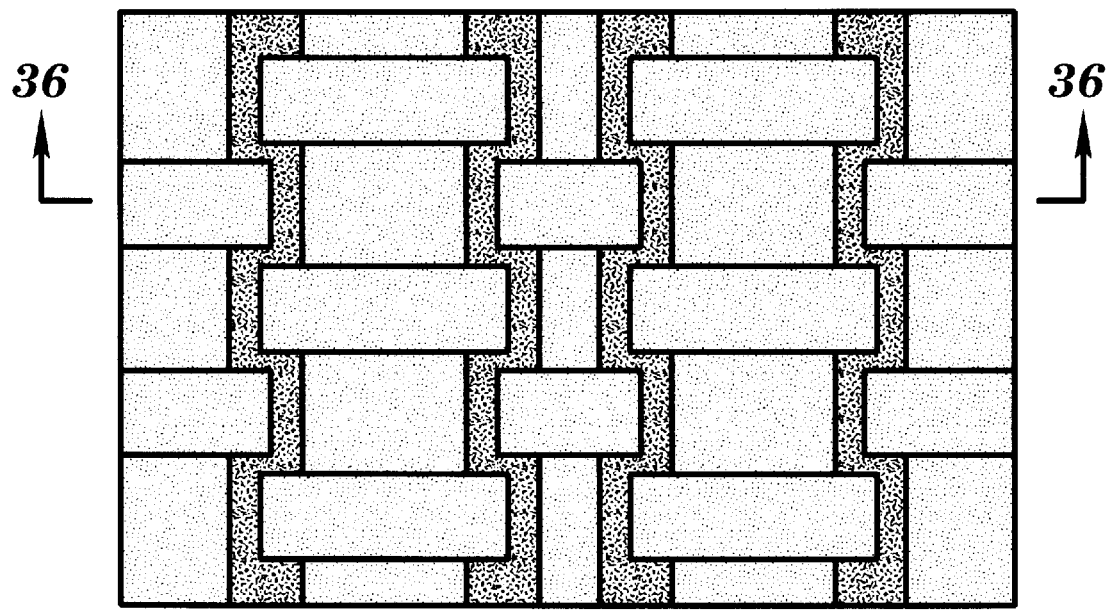
FIG. 35 is a top-down view of a fourth step in a third embodiment of the present invention.
Figure 36:
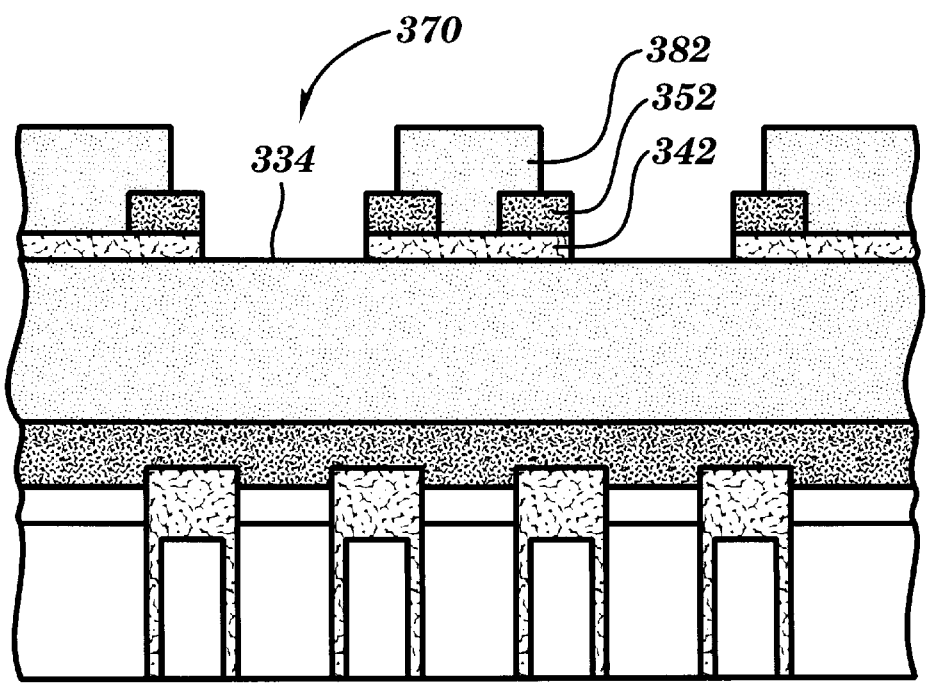
FIG. 36 is a cross-sectional schematic taken across line 36—36 in FIG. 35.

A second layer of resist 380 is then deposited and the resulting structure is defined to complete the support area printing. As shown in FIG. 35, the second pattern of lines in the second layer of resist 380 on the exposed polyimide surface 334 along with the exposed nitride surface 354 is a non-grating pattern that resembles a "dog bone" shape. The pattern must be printed so that the resist does not cover any of the previously opened areas that must eventually form the square shapes. However, a certain amount of laxity is allowed in the overlay of the first pattern to the second pattern because the edges of the resist may fall anywhere within the nitride lines as long as the overlapping portion of the second shape is orthogonal to the previously etched edge. As shown in FIG. 36, the channels 370 have been enlarged, having the upper surface 334 of the polyimide layer as the bottom of the channel 370 and sidewalls of oxide 342, nitride 352 and resist 382. The resist sidewalls 382 are pulled back from the oxide and nitride sidewalls 342, 352, exposing portions of the upper surface 354 of the nitride layer, because of the laxity as discussed above.

Figure 37:
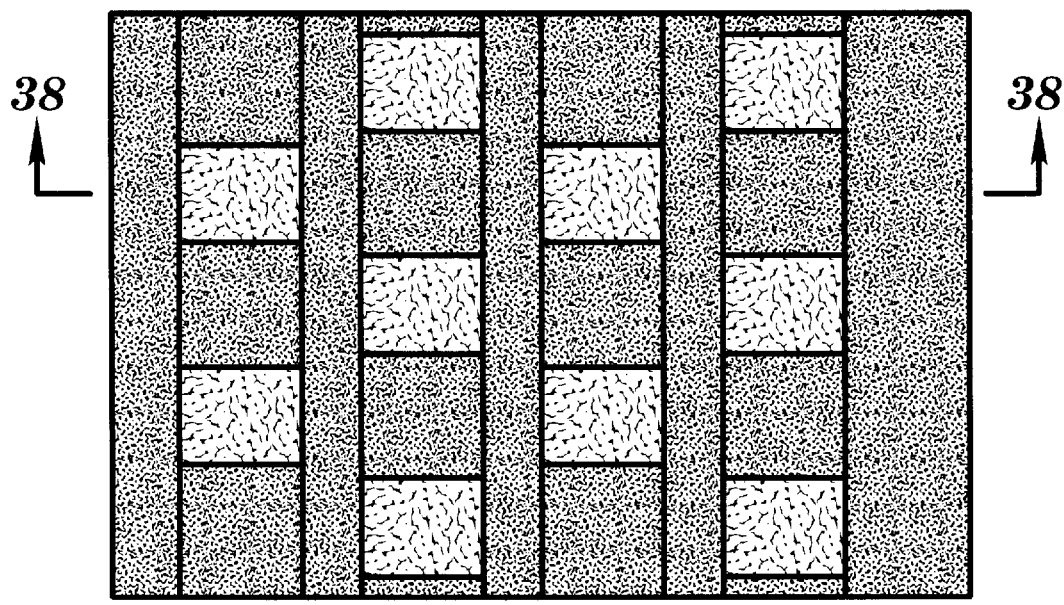
FIG. 37 is a top-down schematic of a fifth step in a third embodiment of the present invention.
Figure 38:
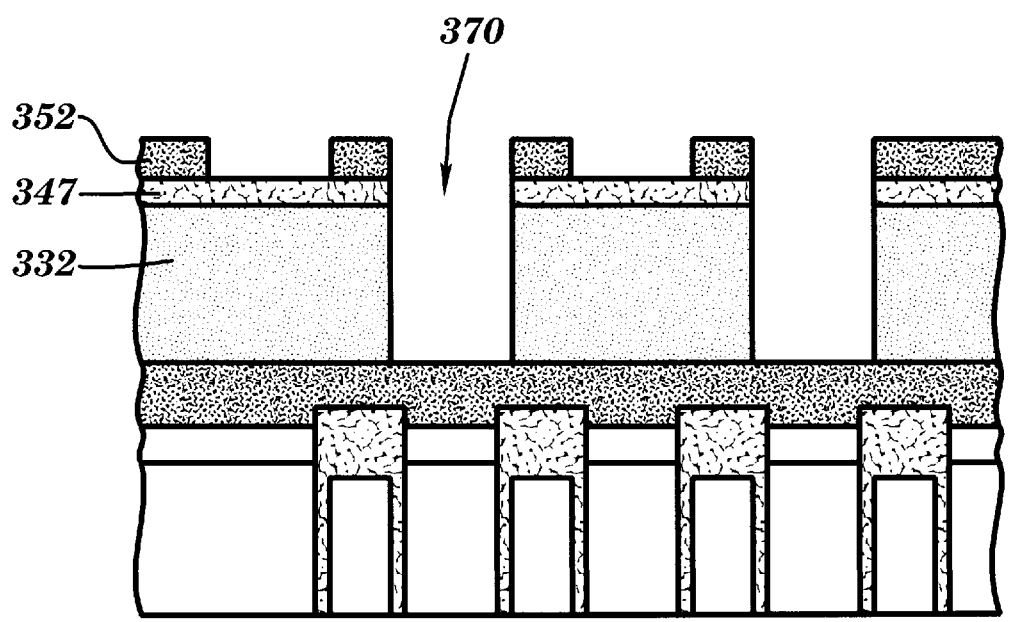
FIG. 38 is a cross-sectional schematic taken across line 38—38 in FIG. 37.
Figure 39:
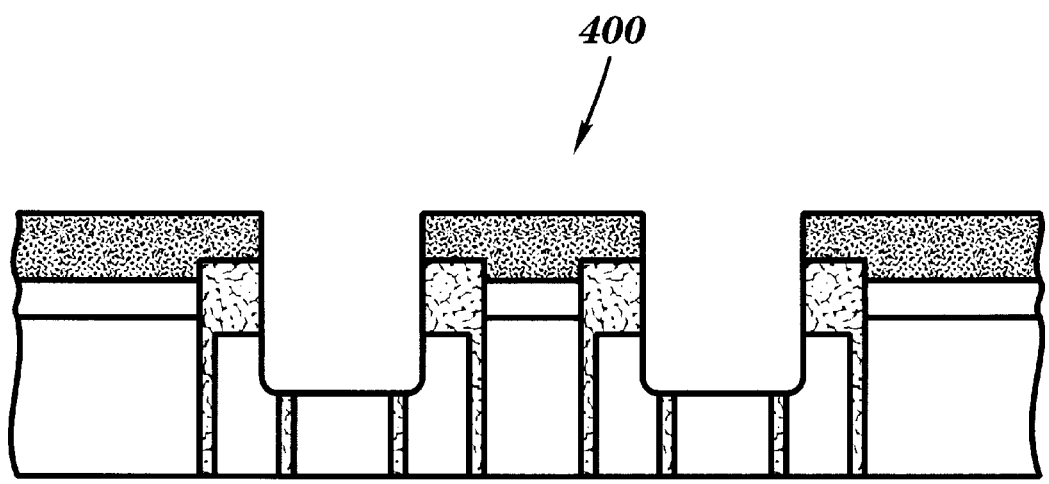
FIG. 39 is a cross-sectional schematic of a sixth step in a third embodiment of the present invention.

The second layer of resist 380 is then stripped, and the organic layer 330 is etched selective to the TEOS and nitride. This results in the structure depicted in FIG. 37. As shown in FIG. 38, the channels 370 have become deeper. The bottom of the channel is the nitride surface 324, and the sidewalls are now organic sidewalls 332, TEOS sidewalls 342, and nitride sidewalls 352. The isolation trenches may now be etched by commonly known methods into the wafer surface using the organic layer 330 as the mask. The usual etching process will strip the additional layers of mask TEOS 340 and nitride 350 during the first phase of the etch. As shown in FIG. 39, the organic layer 330 is then stripped, resulting in the final structure 400. The photo process windows are significantly increased by utilizing this method, and there is full, independent control over the trench length and width.

EXAMPLE 4

Example 3 describes a process in which square-sided trenches are formed for purposes of exposing portions of deep trench storage capacitors. In this Example 4, these same general techniques are used to form the storage capacitor itself, as well vertical single-crystal silicon .pillar. structures on which vertical FETs can be formed. Because the process of the invention produces trenches and pillars that have squared corners, the effective capacitive storage area for each cell is greater than that of conventional trench capacitors having more rounded corners, without increasing the total surface area allocated to each storage cell. Moreover, more of the wafer area allocated for each cell can be used to form the cell itself, because the formed trenches and pillars require less .spare. surface area to account for trench rounding. For example, for the 64M DRAM described below, the total unit cell size can be reduced from 9.3 .squares. (each .square. having dimensions near the resolution limit of the photolithographic tool) to below 8 squares.

Figure 40:
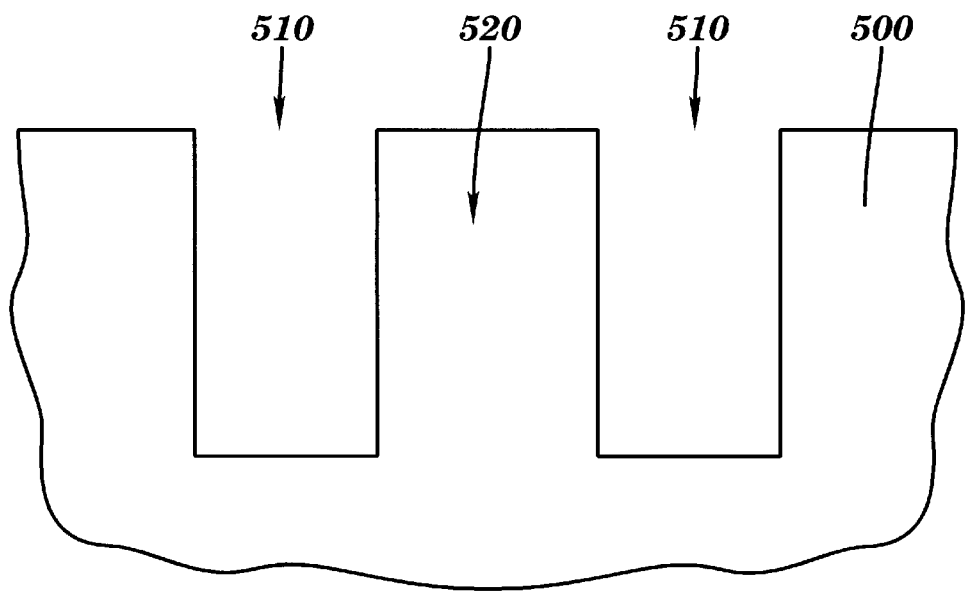
FIG. 40 is a cross-sectional schematic of a first step in forming a trench capacitor configuration, in accordance with a preferred embodiment of the present invention.

With reference to FIG. 40, deep trench slots 510 having squared sidewalls are formed in a substrate 500. The trench will be formed using the imaging and etch techniques described above for forming squared images in Examples 1–3. The trench slot will be formed as described below, and after subsequent processing to define the cell elements, such as devices and storage node, a second slot will be formed angularly relative to the first slot structure to form the final deep trench structures. By spacing the deep trench slots sufficiently close together, the invention forms square sided pillars 520 between the deep trenches 510. In practice, the trenches 510 are 6–10 microns deep and are spaced from one another by a distance of 0.18 microns, such that a pillar 520 is 6–10 microns high and 0.18 microns wide.

Figure 41:
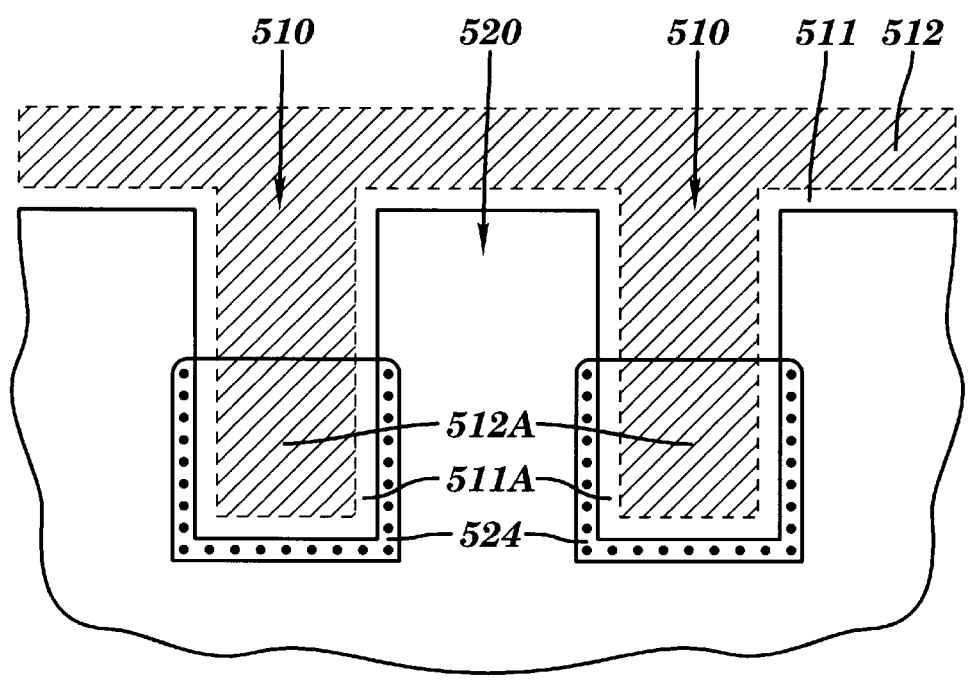
FIG. 41 is a cross-sectional schematic of a second step in forming a trench capacitor configuration, in accordance with a preferred embodiment of the present invention.

As shown in FIG. 41, a layer of silicon oxide/silicon nitride 511 (shown in both dashed and solid lines) is formed to a thickness of 2500 angstroms on the substrate 500 using conventional thermal growth and nitride deposition processes. A layer of doped polysilicon 512 (shown in both dashed and solid lines) is then formed on the substrate, and is etched back (using a plasma etchant such as $Cl_2$ that etches polysilicon without etching the oxide/nitride dielectric) to remove the dashed line portions. As a result, a portion of the oxide/nitride 511 is exposed. The exposed oxide/nitride 511 is etched in a plasma (such as $CHF_3$) that etches these dielectrics without substantially etching silicon, to remove the dashed line portions. As a result, the trench 510 is partially filled with polysilicon 512A (to form the plate of a trench capacitor) with sidewalls having dielectric 511A forming the node dielectric for the trench capacitors. Then a heating cycle is carried out to drive n-type dopant out of polysilicon 512A, through the dielectric into surrounding portions of the silicon substrate, to form diffusion areas 524 that serve as the storage node plate of the trench capacitors.

Figure 42:
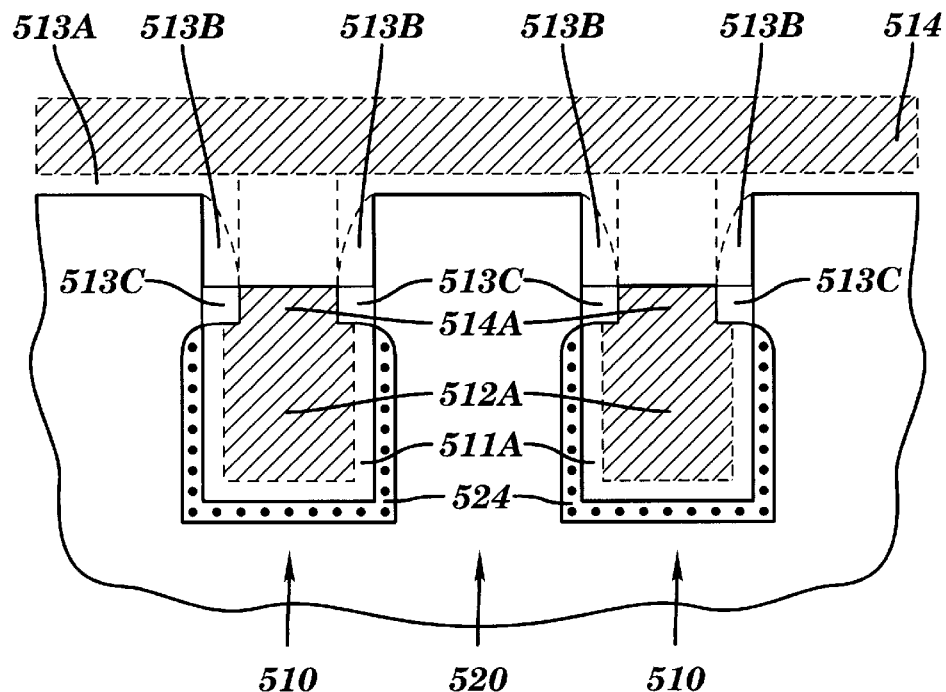
FIG. 42 is a cross-sectional schematic of a third step in forming a trench capacitor configuration, in accordance with a preferred embodiment of the present invention.

As shown in FIG. 42, a thick layer (on the order of 2–300 angstroms) of isolation oxide 513 including portions 513A, 513B, and 513C is then deposited on the substrate 500. This thick layer of oxide will provide vertical isolation (along the side of pillars 520) between the storage capacitor and the vertical FET. The wafer is then subjected to the same plasma etchant as set forth above that is selective to oxide, to remove portion 513A of isolation oxide 513 on the horizontal surface of wafer 500. Then a second layer of doped polysilicon 514 is deposited and etched using the same process as set forth above, exposing portion 513B of the isolation oxide 513B while covering portions 513A. The exposed portion 513 is subsequently removed using the same oxide etchant used previously, resulting in an isolating oxide .collar. structure 513C that is covered with polysilicon 514A.

Figure 43:
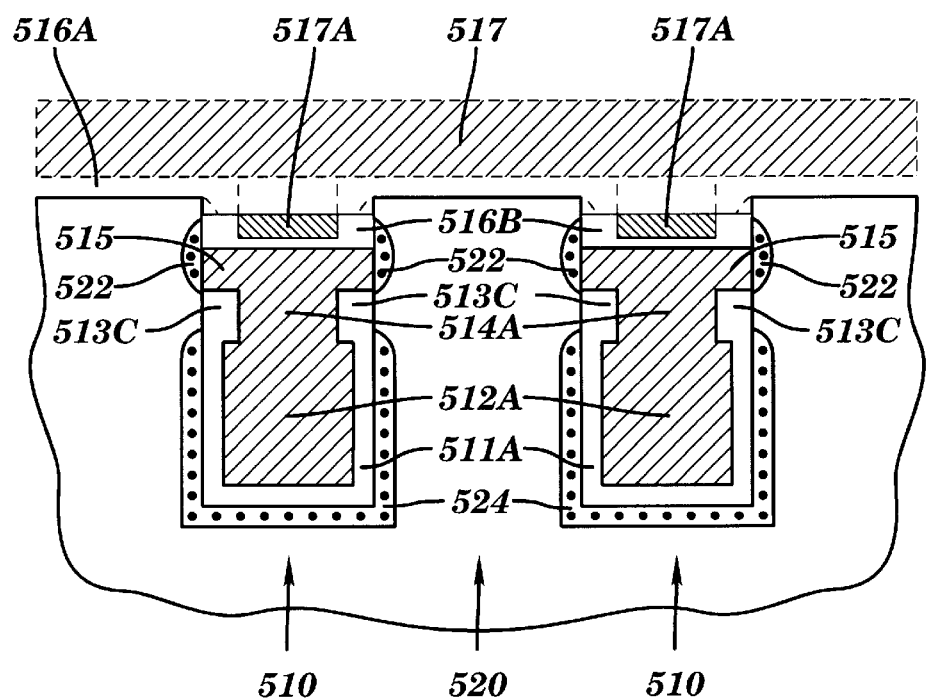
FIG. 43 is a cross-sectional schematic of a fourth step in forming a trench capacitor configuration, in accordance with a preferred embodiment of the present invention.

As shown in FIG. 43, a third layer of n-doped polysilicon 515 is deposited and etched back (using the same process as defined above) to create a portion of polysilicon 515 that extends over the oxide collar 513C. The wafer is then heated sufficiently to drive the n-type dopant from the doped polysilicon region 515 into the surrounding silicon, creating an n-type doped region 522 that will serve as one electrode of the vertical FET. A layer of oxide 516 (50–200 angstroms thick on polysilicon, 20–80 angstroms on single crystal silicon, shown in both solid and dashed lines) is then grown on the wafer, covering the exposed surface of polysilicon 515. A fourth layer of doped polysilicon 517 (shown in both dashed and solid lines) is deposited, and is etched back using the process described above to remove the dashed portions of layer 517, leaving polysilicon 517A on portions 516B of the oxide layer. The dashed portions 516A of the oxide layer are then removed. The oxide layer 516B serves as the gate dielectric for the vertical FET. Note that the oxide layer 516B is thicker on the bottom (i.e. on the order of 150 angstroms in thickness) to provide electrical isolation from the adjacent capacitor plate.

Figure 44:
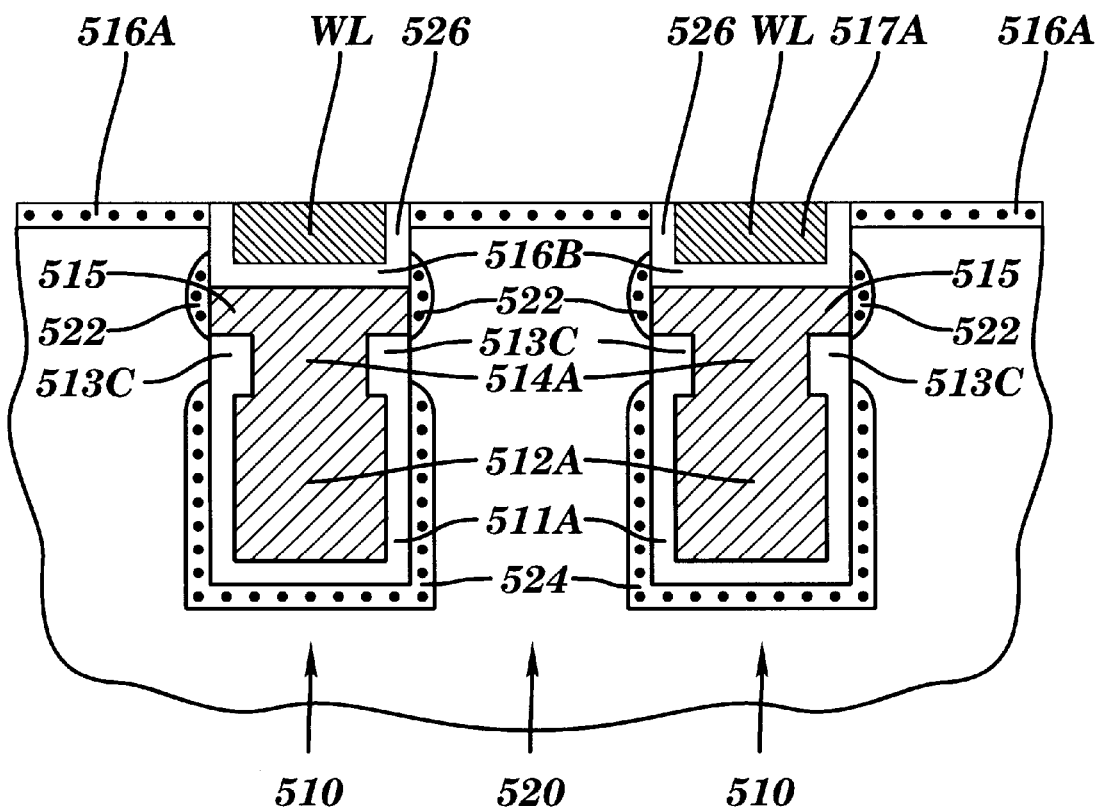
FIG. 44 is a cross-sectional schematic of a fifth step in forming a trench capacitor configuration, in accordance with a preferred embodiment of the present invention.

As shown in FIG. 44, the remaining structures of the vertical FET are formed. Oxide dielectric 526 is formed on the upper sidewalls of the trench by depositing a layer of oxide and then carrying out a plasma etch to remove horizontal portions of the layer, leaving only the vertical portions in the trench. Then a diffusion region is formed by implanting n-type dopant into the exposed upper portions of the pillars 520, to form bit line diffusions. To form the isolated pillars, a second lithography step in the square imaging process is employed. In this step, a second slot is formed to define the length of the pillar, similar to the steps outlined in Examples 1–3. For example, the imaging technique set forth in FIGS. 32–38 of Example 3 (which were used to provide deep trenches with square sides for exposing deep trench storage capacitors) is used to define the pillars. The length of the pillar can be 0.18 um. Following pillar definition, isolation is formed on alternate pillars by means of conventional lithography and isolation trench methods. Appropriate metal contacts and layers are formed to (a) define word lines that interconnect adjacent polysilicon portions 517A orthogonal to the plane of the Figs. (i.e. into the page), and (b) define bit lines orthogonal to the word lines that interconnect adjacent bit line diffusions. Thus, by virtue of the invention, a vertical FET (having source diffusion BL, gate electrode 517A, and drain diffusion 522) is formed that can access the information stored in a trench capacitor formed by polysilicon electrode 515, 514A, 512A, dielectric 511A, and diffusion regions 524.

While the invention has been particularly shown and described with reference to preferred exemplary embodiments thereof, it will be understood by those skilled in the art that the foregoing and other changes in form and details may be made therein without departing from the spirit and scope of the invention.

Accordingly, what is claimed is:

1. A memory chip, comprising a plurality of trench capacitors, a plurality of transistors coupled to respective ones of said trench capacitors, and a plurality of isolation regions between respective trench capacitors, said isolation regions being formed in isolation trenches having at least one dimension near a resolution limit of a photoexposure tool that photolithographically defined the isolation trenches, said isolation trenches having at least two sidewalls defining a sharp-edged corner, said isolation trenches at least partially overlapping said respective trench capacitors.

2. A semiconductor chip having a plurality of apertures therein defined by a photoexposure tool having a given resolution limit, wherein at least one dimension defined by two sidewalls of each of said plurality of apertures is near the given resolution limit of said photo exposure tool, said sidewalls intersecting at a sharp-edged corner.

3. The semiconductor chip of claim 2, wherein said plurality of apertures comprise a plurality of trenches formed in a semiconductor substrate, and wherein said plurality of trenches define pillars in said substrate.

4. The semiconductor chip of claim 3, wherein both a storage capacitor and a vertical FET are formed in each of said plurality of trenches as well as pillars adjacent thereto.

5. An integrated circuit chip comprising isolation trenches, wherein the integrated circuit chip is produced by a method comprising the steps of:

providing a substrate having a first layer of selectively etchable material thereon, wherein the substrate includes:

a layer of gate polysilicon on a surface of the substrate;

a layer of oxide on an upper surface of the gate polysilicon;

a layer of nitride on an upper surface of the layer of oxide;

a layer of organic material on an upper surface of the layer of nitride; and a thin layer of oxide on an upper surface of the layer of organic material, and wherein the first layer of selectively etchable material is a thin layer of nitride on an upper surface of the thin layer of oxide;

forming a plurality of parallel edged openings in the first layer of etchable material, wherein the openings are aligned to form pairs of straight-edged first regions, and wherein the forming of a plurality of parallel edged openings is accomplished by a process comprising using a photoexposure tool to expose a photoresist pattern;

depositing a layer of selectively etchable material over the openings in said first layer of etchable material;

forming a second plurality of parallel edged openings in the layer of etchable material, said second plurality of openings intersecting adjacent pairs of said straight-edged first regions forming a plurality of second regions bounded by two edges of one of said first regions and two edges of one of said second regions;

selectively etching the thin layer of oxide in the plurality of second regions;

removing remaining areas of the etchable material;

selectively etching the layer of organic material in the plurality of second regions;

selectively etching the layer of nitride in the plurality of second regions, thereby removing remaining areas of the thin layer of nitride;

selectively etching the layer of oxide in the plurality of second regions, thereby removing remaining areas of the thin layer of oxide;

selectively etching the layer of gate polysilicon, thereby exposing the substrate in the plurality of second regions;

processing the exposed second regions of the substrate to form isolation trenches, wherein the isolation trenches each have at least one dimension near a resolution limit of the photoexposure tool; and processing the substrate in the second regions defined by said openings and said second openings.

6. An integrated circuit chip comprising deep trench capacitors, wherein the integrated circuit chip is produced by a method comprising the steps of:

providing a substrate having a first layer of selectively etchable material thereon, wherein the substrate includes:

a first layer of polysilicon on an upper surface of the substrate;

a first layer of silicon nitride on an upper surface of the first layer of polysilicon;

a first layer of silicon oxide on an upper surface of the first layer of silicon nitride;

a second layer of polysilicon on an upper surface of the first layer of silicon oxide; and a second layer of silicon nitride on an upper surface of the second layer of polysilicon, and wherein the first layer of selectively etchable material is a second layer of silicon oxide on an upper surface of the second layer of silicon nitride;

forming a plurality of parallel edged openings in the first layer of etchable material, wherein the openings are aligned to form pairs of straight-edged first regions, and wherein the forming of a plurality of parallel edged openings is accomplished by a process comprising using a photoexposure tool to expose a photoresist pattern;

depositing a layer of selectively etchable material over the openings in said first layer of etchable material;

forming a second plurality of parallel edged openings in the layer of etchable material, said second plurality of openings intersecting adjacent pairs of said straight-edged first regions forming a plurality of second regions bounded by two edges of one of said first regions and two edges of one of said second regions;

forming a plurality of cornered openings in the second layer of silicon nitride in the second regions defined by the first and second openings;

selectively etching the second layer of polysilicon to expose cornered areas of the first layer of silicon oxide;

selectively etching the first layer of silicon oxide to expose cornered areas of the first layer of silicon nitride, thereby removing any remaining portions of the second layer of silicon oxide;

selectively etching the first layer of silicon nitride to expose cornered areas of the first layer of polysilicon, thereby removing any remaining portions of the second layer of silicon nitride;

selectively etching the first layer of polysilicon to expose cornered areas of the substrate, thereby removing remaining portions of the second layer of polysilicon;

processing the exposed cornered areas of the substrate to form deep trench capacitors, wherein the deep trench capacitors each have at least one dimension near a resolution limit of the photoexposure tool; and processing the substrate in the second regions defined by said openings and said second openings.

7. The memory chip of claim 1, wherein said isolation region isolates said trench capacitor from said transistor along a side of said isolation trench.

* * * * *

UNITED STATES PATENT AND TRADEMARK OFFICE
CERTIFICATE OF CORRECTION

PATENT NO. : 5,959,325
DATED : Sep. 28, 1999
INVENTOR(S) : Adair et al.

It is certified that error appears in the above-identified patent and that said Letters Patent is hereby corrected as shown below:

Column 5, line 44, after "37;" delete -- and --.
Column 13, line 32, delete "513B" and insert -- 513 --.
Column 13, line 33, delete "513" and insert --513B--.

Signed and Sealed this

Twenty-fifth Day of April, 2000

Attest:

Q. TODD DICKINSON

*Attesting Officer*  *Director of Patents and Trademarks*